(12) United States Patent
Kikuchi et al.

(10) Patent No.: US 8,482,096 B2
(45) Date of Patent: Jul. 9, 2013

(54) SEMICONDUCTOR PHOTODETECTOR AND MANUFACTURING METHOD THEREFOR

(75) Inventors: Matobu Kikuchi, Tokyo (JP); Yasuo Nakajima, Tokyo (JP); Yoshiyuki Nakashima, Hyogo (JP); Hitoshi Sakuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1081 days.

(21) Appl. No.: 12/038,247

(22) Filed: Feb. 27, 2008

(65) Prior Publication Data

US 2009/0072338 A1 Mar. 19, 2009

(30) Foreign Application Priority Data

Sep. 18, 2007 (JP) ................................. 2007-241061

(51) Int. Cl.
*H01L 21/70* (2006.01)

(52) U.S. Cl.
USPC .................................. 257/522; 257/E23.013

(58) Field of Classification Search
USPC ..................... 438/57, 98, 411, 421, 597, 619; 257/E31.001, E23.013, 522; 436/57, 98, 436/411, 421, 597, 619
See application file for complete search history.

(56) References Cited

U.S. PATENT DOCUMENTS 3,846,820 A * 11/1974 Lampe et al. ................. 257/443
6,501,104 B2   12/2002 Inomoto

FOREIGN PATENT DOCUMENTS

| JP | 60-43822 A | 3/1985 |
| JP | 62-33425 A | 2/1987 |
| JP | 63-160283 A | 7/1988 |
| JP | 5-218212 | 8/1993 |
| JP | 5-275549 | 10/1993 |
| JP | 8-97461 A | 4/1996 |
| JP | 8-213345 A | 8/1996 |
| JP | 2001-29811 A | 10/2001 |
| JP | 2001-298211 A | 10/2001 |

OTHER PUBLICATIONS

Taiwanese Patent Office, English translation of Office Action (Oct. 25, 2011).

* cited by examiner

*Primary Examiner* — Matthew Reames
(74) *Attorney, Agent, or Firm* — Leydig, Voit & Mayer, Ltd.

(57) ABSTRACT

A method for manufacturing a semiconductor photodetector includes: forming an insulating film on a semiconductor substrate; forming an electrode on and in contact with a predetermined area of a surface of the semiconductor substrate; forming a resist on the insulating film after forming the electrode; forming a power supply layer of a metal on the resist and the electrode; plating a surface of a portion of the power supply layer with a metal coating, after forming the power supply layer, the portion overlying and being in contact with the electrode; after the plating, etching and removing a part of the power supply layer leaving a portion that is covered with the metal coating and is an extension of the electrode; and removing the resist after etching the power supply layer.

13 Claims, 18 Drawing Sheets

FIG. 4A
FIG. 4B
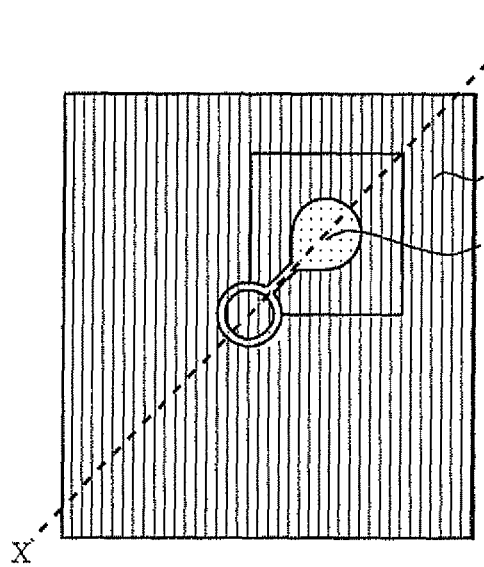
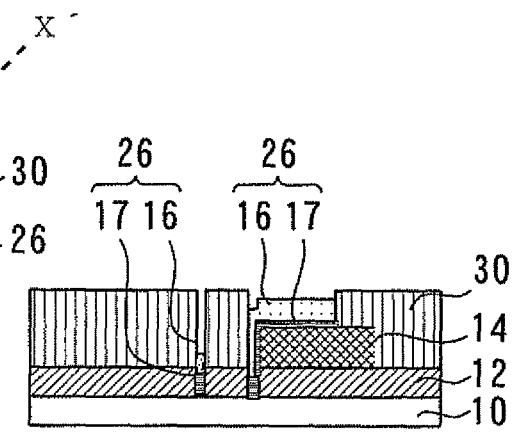
FIG. 5A
FIG. 5B
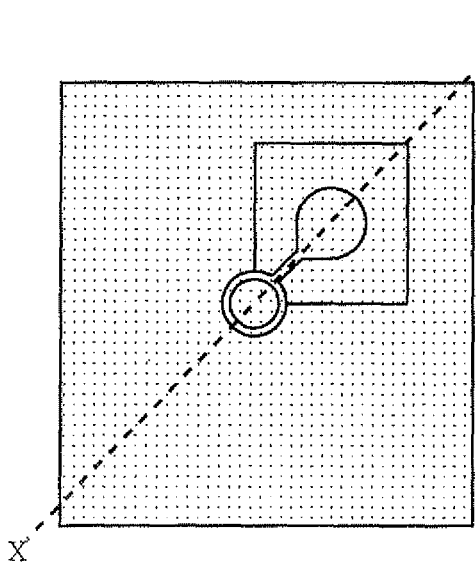
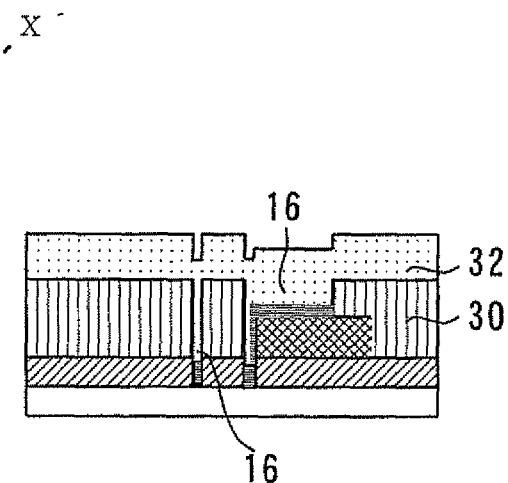

FIG. 12A
FIG. 12B
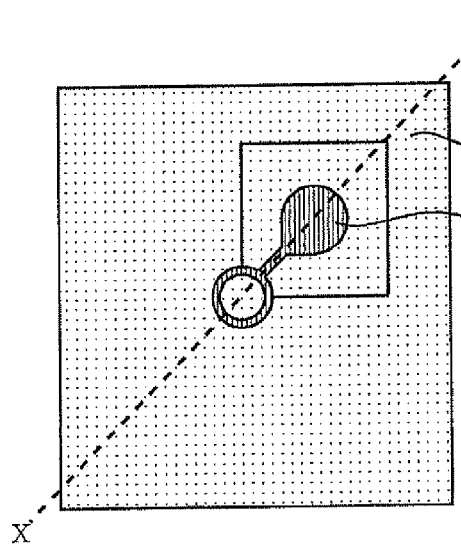
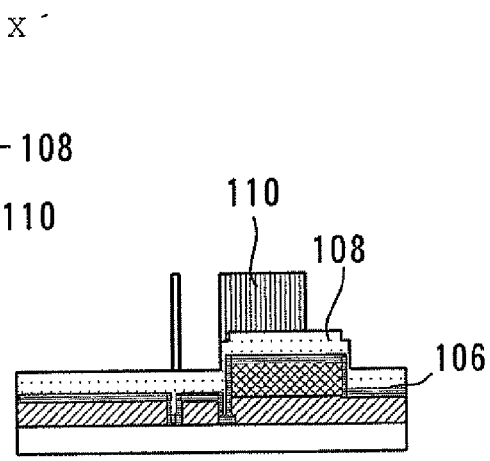
FIG. 13A
FIG. 13B
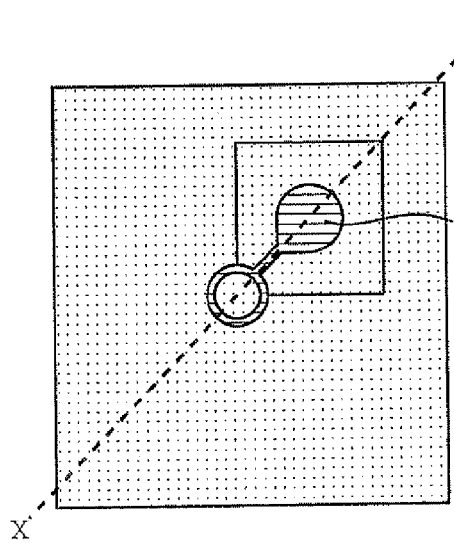
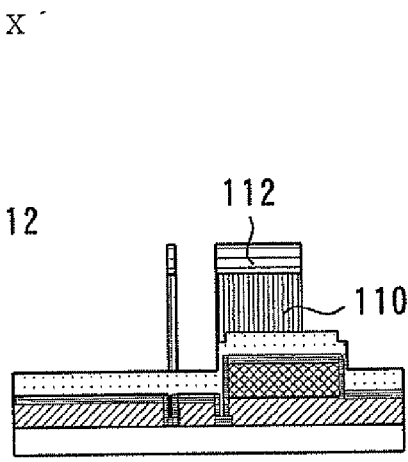

FIG. 14A
FIG. 14B
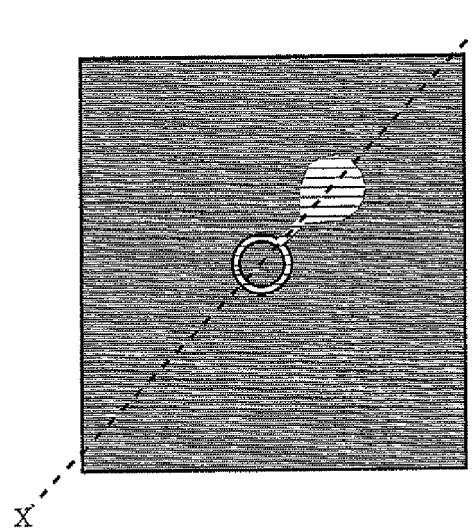
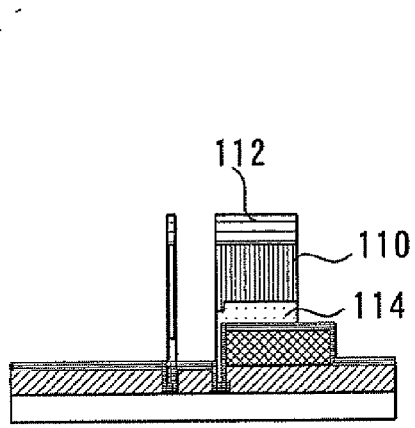
FIG. 15A
FIG. 15B
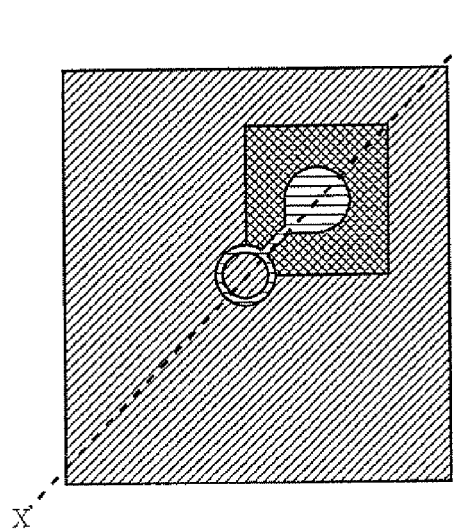
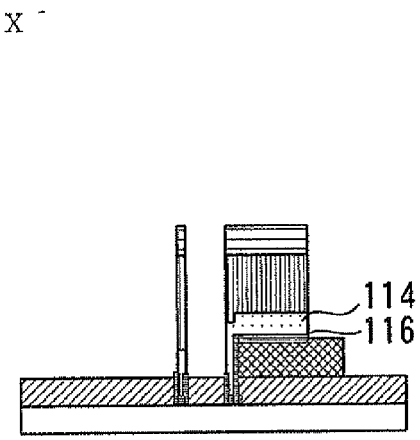

FIG. 24A
FIG. 24B
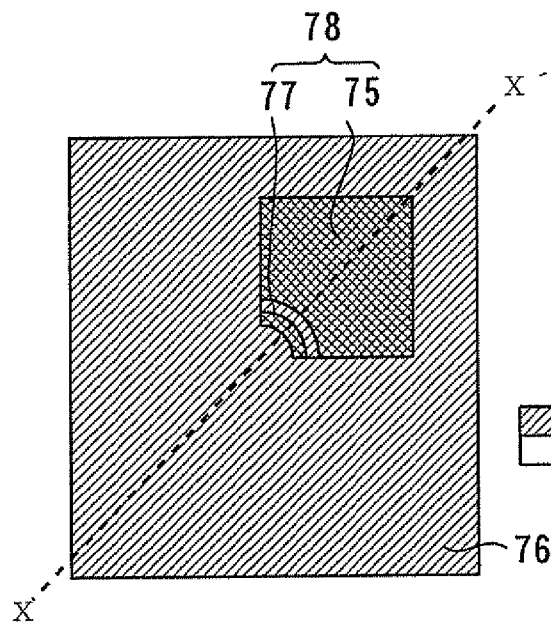
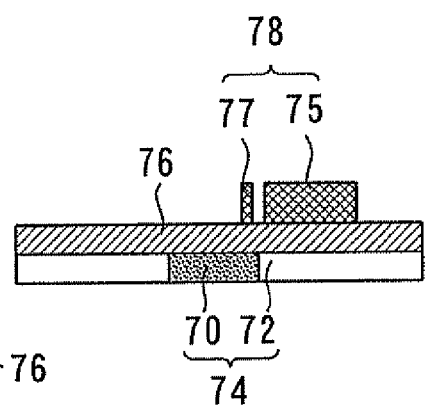
FIG. 25A
FIG. 25B
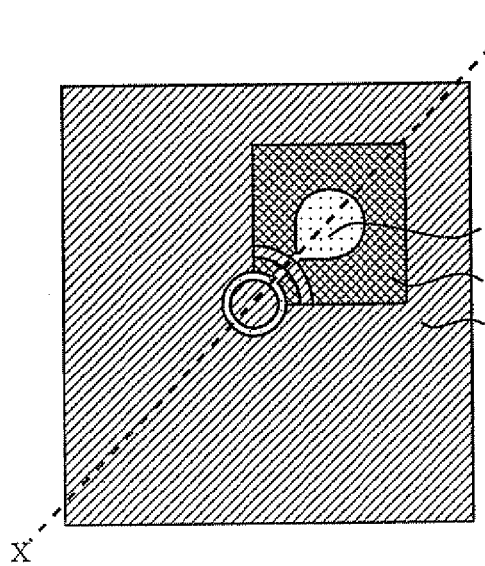
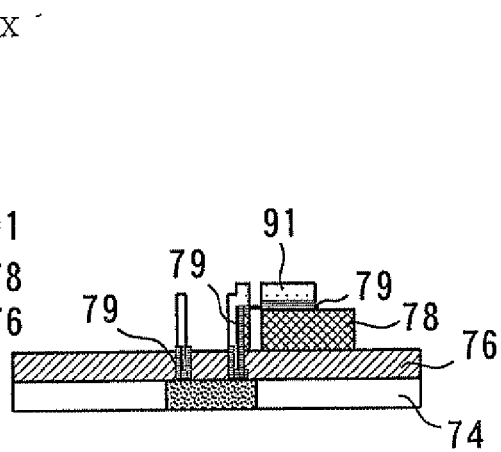

FIG. 32A
FIG. 32B
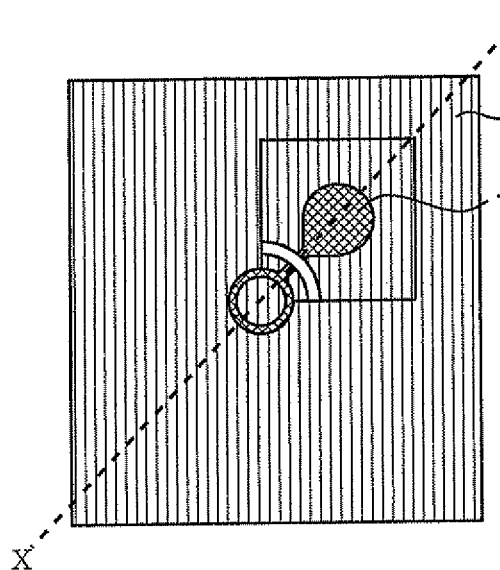
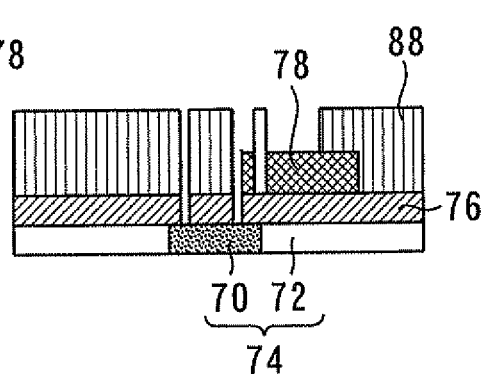
FIG. 33A
FIG. 33B
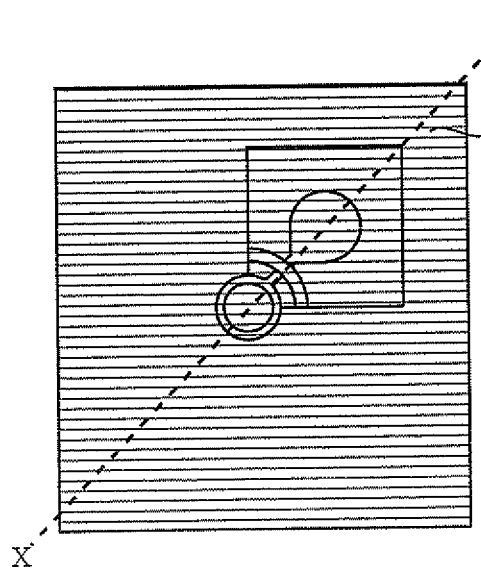
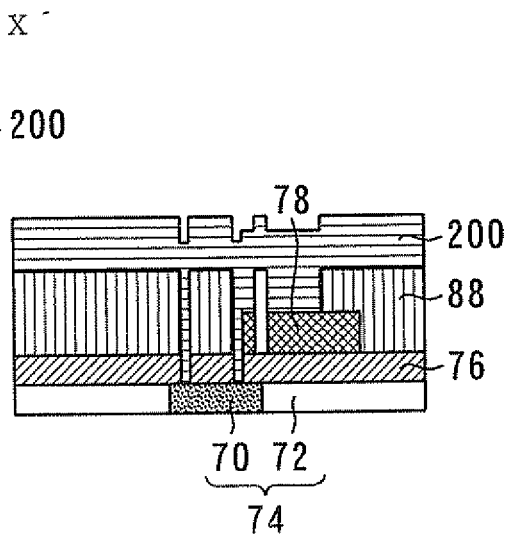

SEMICONDUCTOR PHOTODETECTOR AND MANUFACTURING METHOD THEREFOR

BACKGROUND OF THE INVENTION

1. Field of the Invention

The present invention relates to a semiconductor photodetector, and more particularly to a semiconductor photodetector whose upper surface insulating films have the desired thicknesses, and which therefore is adapted to receive and utilize incident light on its upper surface. The invention also relates to a method for manufacturing such a semiconductor photodetector.

2. Background Art

A semiconductor photodetector converts received optical energy into electrical energy and passes the resulting electrical signal to an external device. Its upper surface is covered with insulating films, except for the portion on and in contact with which the upper electrode lies. An important property that such insulating films must have is low reflectivity to the light incident to the photodetector.

Further, in the case of a photodetector of the type adapted to receive and utilize incident light on its upper surface, the upper metal electrode is preferably plated with a metal coating to provide sufficient resistance to external force applied to the electrode due to wiring bonding, etc. Such plating requires that the semiconductor process form a power supply layer on the upper surface insulating films. This power supply layer usually has a structure that includes a Ti layer and an Au layer formed on the Ti layer. The Ti layer underlying the Au layer enhances the adhesion to the insulating films. It should be noted that after the above plating, the unwanted portions of the power supply layer are removed.

Prior art includes JP-A Nos. 5-275549 and 5-218212.

However, such semiconductor photodetectors (having their upper electrode plated with a metal coating by the above plating process) suffer the following disadvantage. Treatment with an HF based chemical solution is required to remove the Ti layer making up the power supplying layer after the plating process. This means that the insulating films under the power supply layer may undergo a reduction in thickness due to such treatment. It should be noted that etching a metal (not necessarily limited to Ti) formed on an insulating film generally reduces the thickness of the film to some degree. This may prevent the insulating film from functioning as a low reflecting coating having the desired low reflectivity.

SUMMARY OF THE INVENTION

The present invention has been devised to solve the above problems. It is, therefore, an object of the present invention to provide a semiconductor photodetector whose upper surface insulating films function as low reflecting coatings having the desired low reflectivity and to provide a method for manufacturing such a semiconductor photodetector.

According to one aspect of the present invention, A method for manufacturing a semiconductor photodetector, includes a semiconductor providing step of providing a semiconductor, an insulating film forming step of forming an insulating film on the semiconductor, an electrode forming step of forming an electrode on and in contact with a predetermined area of a surface of the semiconductor, an insulating film-protecting resist-forming step of forming a resist on the insulating film after the electrode forming step, a power supply layer forming step of forming a power supply layer of a metal on the resist and the electrode, a plating step of plating a surface of a portion of the power supply layer with a metal coating after the power supply layer forming step, the portion overlying and being in contact with the electrode, a power supply layer etching step of, after the plating step, etching away the power supply layer except for a portion that (is covered with the metal coating and) serves an extension to the electrode, and an insulating film-protecting resist-removing step of removing the resist after the power supply layer etching step.

According to another aspect of the present invention, a method for manufacturing a semiconductor photodetector includes a semiconductor providing step of providing a semiconductor, an insulating film forming step of forming an insulating film on the semiconductor, an insulating film-protecting resist-forming step of forming a resist on the insulating film, a metal layer forming step of forming a metal layer on and in contact with a predetermined area of a surface of the semiconductor after the insulating film-protecting resist-forming step, the metal layer extending to cover the resist, a plating step of plating a surface of a portion of the metal layer with a metal coating after the metal layer forming step, the portion serving as an electrode, a metal layer etching step of, after the plating step, etching away the metal layer except for the portion serving as the electrode, and an insulating film-protecting resist-removing step of removing the resist after the metal layer etching step.

According to another aspect of the present invention, a method for manufacturing a semiconductor photodetector, includes a semiconductor providing step of providing a semiconductor, an insulating film forming step of forming an insulating film on the semiconductor, an electrode forming step of forming an electrode on and in contact with a predetermined area of a surface of the semiconductor, an insulating film-protecting resist-forming step of forming a resist on the insulating film after the electrode forming step, a power supply layer forming step of forming a power supply layer of Au on the resist and the insulating film after the insulating film-protecting resist-forming step, a plating step of plating a surface of a portion of the power supply layer with a metal coating after the power supply layer forming step, the portion overlying and being in contact with the electrode, and a power supply layer etching step of etching away the power supply layer except for the portion in contact with the electrode after the plating step.

According to another aspect of the present invention, a method for manufacturing a semiconductor photodetector includes a semiconductor providing step of providing a semiconductor, an insulating film forming step of forming an insulating film on the semiconductor, an electrode forming step of forming an electrode on and in contact with a predetermined area of a surface of the semiconductor, a power supply layer forming step of forming a power supply layer of Au on the electrode and the insulating film after the electrode forming step, a plating step of plating a surface of a portion of the power supply layer with a metal coating after the power supply layer forming step, the portion overlying and being contact with the electrode, and a power supply layer etching step of etching away the power supply layer except for the portion in contact with the electrode after the plating step.

According to another aspect of the present invention, a semiconductor photodetector includes a semiconductor including a first conductivity type region and a second conductivity type region in contact with the first conductivity type region, an insulating film formed on a surface of the semiconductor and including a narrow empty space located directly above a border between the first and second conductivity type regions, and an electrode in contact with the insulating film and forming an air bridge structure over the narrow empty space located directly above the border.

According to another aspect of the present invention, a method for manufacturing a semiconductor photodetector includes a semiconductor providing step of providing a semiconductor including a first conductivity type region and a second conductivity type region, a first insulating film forming step of forming a first insulating film on a surface of the semiconductor, the first insulating film extending over a border between the first and second conductivity type regions, a second insulating film forming step of forming a second insulating film on the first insulating film, the second insulating film including a narrow empty space located directly above the border, the narrow empty space extending between end faces of the second insulating film and having lateral narrow open sides that extend perpendicular to the surface of the semiconductor, an electrode forming step of forming an electrode on and in contact with a predetermined area of the surface of the semiconductor, the electrode extending to cover a portion of a surface of the second insulating film, an insulating film-protecting resist-forming step of forming an insulating film-protecting resist on the first and second insulating films after the electrode forming step, the insulating film-protecting resist filling the narrow empty space located directly above the border, a power supply layer forming step of forming a power supply layer of a metal on the insulating film-protecting resist and the electrode, a plating step of plating a surface of the power supply layer with a metal coating, and an insulating film-protecting resist-removing step of removing the insulating film-protecting resist after the power supply layer forming step.

According to another aspect of the present invention, a method for manufacturing a semiconductor photodetector includes, a semiconductor providing step of providing a semiconductor including a first conductivity type region and a second conductivity type region, a first insulating film forming step of forming a first insulating film on a surface of the semiconductor, the first insulating film extending over a border between the first and second conductivity type regions, a second insulating film forming step of forming a second insulating film on the first insulating film, the second insulating film including a narrow empty space located directly above the border, the narrow empty space extending between end faces of the second insulating film and having lateral narrow open sides that extend perpendicular to the surface of the semiconductor, an insulating film-protecting resist-forming step of forming an insulating film-protecting resist on the first and second insulating films except for an area where a metal layer is to be formed in contact with the semiconductor, the insulating film-protecting resist filling the narrow empty space, a metal layer forming step of forming the metal layer over the insulating film-protecting resist, the metal layer being in contact with the area of the semiconductor, a plating step of forming a metal coating, and an insulating film-protecting resist-removing step of removing the insulating film-protecting resist after the metal layer forming step.

Other and further objects, features and advantages of the invention will appear more fully from the following description.

BRIEF DESCRIPTION OF THE DRAWINGS

FIG. 4 is diagram illustrating the step of forming an insulating film;
FIG. 5 is diagram illustrating the step of forming a power supply layer;
FIG. 10 to FIG. 16 are diagrams illustrating comparative method for manufacturing a semiconductor photodetector;
FIG. 24 is the diagram illustrating the step of forming insulating films;
FIG. 25 is the diagram illustrating the step of forming an electrode;
FIG. 32 is the diagram illustrating a composition before the formation of metal layer;
and
FIG. 33 is the diagram illustrating the step of forming a metal layer.

DETAILED DESCRIPTION OF THE PREFERRED EMBODIMENTS

First Embodiment

Figure 1A:
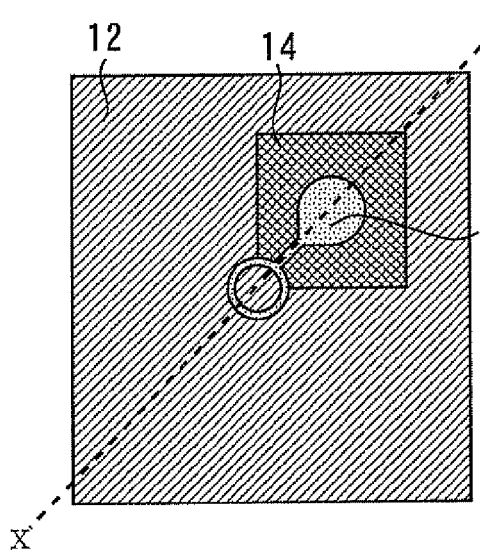
FIG. 1 shows a semiconductor photodetector according to a first embodiment.
Figure 1B:
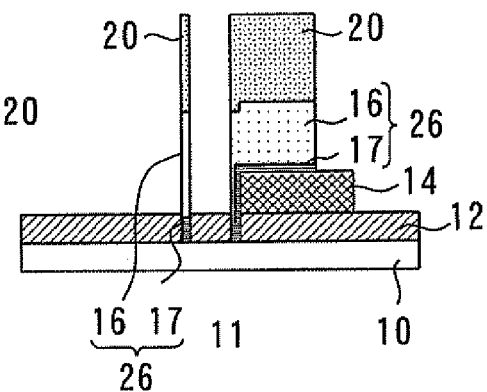
Figure 1C:
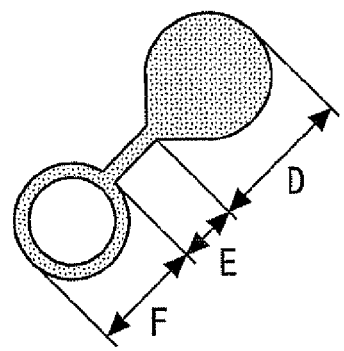

FIG. 1 (including FIGS. 1A to 1C) shows a semiconductor photodetector according to a first embodiment of the present invention. FIG. 1A is a plan view of the semiconductor photodetector, and FIG. 1B is a cross-sectional view taken along broken line X-X' of FIG. 1A. It should be noted that, like FIG. 1, each of the following figures includes two or more figures designated with the suffixes "A," "B," "C," and so on, respectively, wherein the figure designated with the suffix "B" is a cross-sectional view taken along broken line X-X' of the figure designated with the suffix "A," which shows a plan view. The configuration of the semiconductor photodetector of the present embodiment will now be described with reference to FIGS. 1A and 1B. This semiconductor photodetector includes a semiconductor (or semiconductor substrate) 10 made, e.g., of InP. The semiconductor 10 includes a photodiode formed therein which is the primary functional component of the semiconductor photodetector. A first insulating film 12 of, e.g., SiN is formed over the surface of the semiconductor 10, and a second insulating film 14 is formed on a predetermined area of the surface of the first insulating film 12. A portion of an electrode (described later) is formed on the second insulating film 14.

An annular trench is formed in a predetermined portion of the first insulating film 12 (see FIGS. 1A and 1B). A Ti layer 17 is formed within this trench such that it is in contact with the semiconductor 10. That is, the surface of the semiconductor 10 is covered with the first insulating film 12 and the Ti layer 17. Further, the Ti layer 17 extends to cover the walls of the trench in the first insulating film 12 and partially cover a sidewall and the top surface of the second insulating film 14.

An Au layer 16 is formed to just cover the top surface of the Ti layer 17. The Ti layer 17 and the Au layer 16 together form an electrode 26. The entire top surface of the Au layer 16 is plated with a metal coating 20. The metal coating 20 serves to enhance the resistance of the semiconductor photodetector or the electrode to external force applied thereto due to wire bonding, etc. FIG. 1C shows a detail plan view of the metal coating 20. Referring to FIG. 1C, the metal coating 20 includes an annular portion F, a connection or bridge portion E, and a round portion D. It should be noted that the electrode 26 has the same shape in plan as the metal coating 20 shown in FIG. 1C since the metal coating 20 is formed to just cover the top surface of the electrode 26. Therefore, the electrode 26 also includes an annular portion F, a connection portion E, and a round portion D. The connection portion E and the round portion D of the electrode 26 are formed on the second insulating film 14, and the annular portion F of the electrode 26 is formed on the semiconductor 10.

This completes the description of the configuration of the semiconductor photodetector according to the present embodiment. A method for manufacturing this semiconductor photodetector will now be described with reference to FIGS. 2 to 9.

Figure 2A:
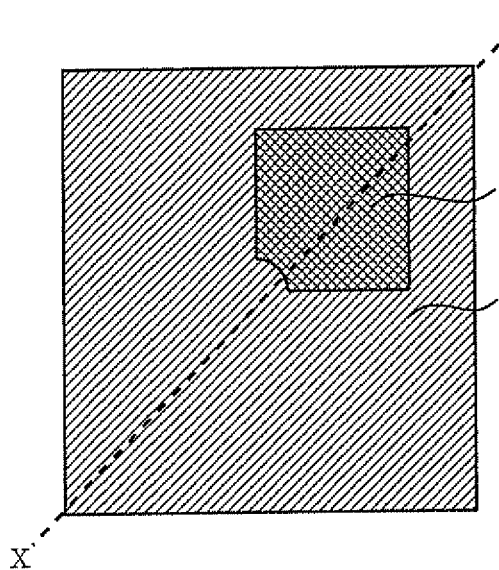
FIG. 2 is diagram illustrating the step of forming insulating films.
Figure 2B:
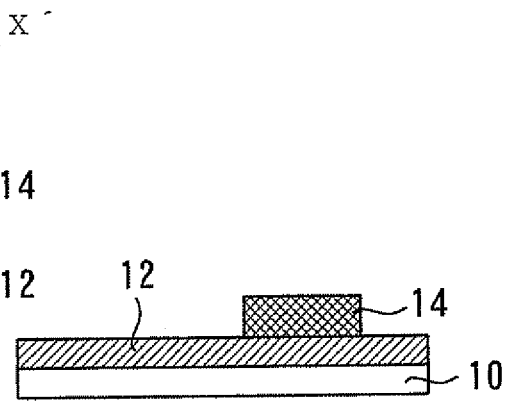

FIGS. 2A and 2B are diagrams illustrating the step of forming insulating films on a semiconductor 10 (hereinafter referred to as the "insulating film forming" step). Specifically, in this step a first insulating film 12 is formed over the entire surface of the semiconductor 10, and a second insulating film 14 is formed on a predetermined area of the surface of the first insulating film 12, as shown in FIG. 2B. The second insulating film 14 is of a rectangular shape in plan with one corner cut out to form an arc-shaped recess, as shown in FIG. 2A. The curvature of this recess is determined by the desired shape of the electrode formed later in the process. Further, the position of the second insulating film 14 is also determined by the desired position of the electrode (formed on the second insulating film 14). The first insulating film 12 and the second insulating film 14 protect the semiconductor 10, as well as serve as low reflecting coatings. That is, the first and second insulating films 12 and 14 are formed to have such a thickness as to fully protect the semiconductor 10 and to serve as low reflecting coatings having the desired reflectivity.

Figure 3A:
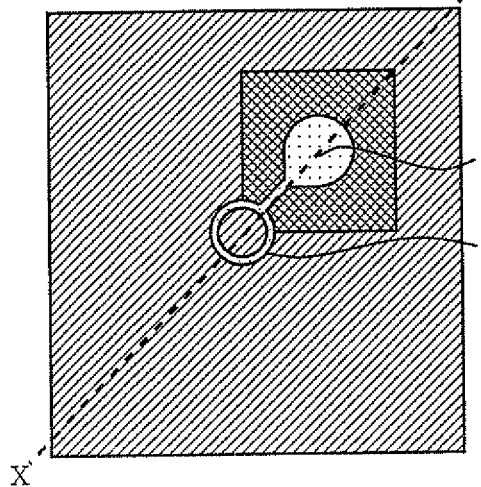
FIG. 3 is diagram illustrating the step of forming an electrode.
Figure 3B:
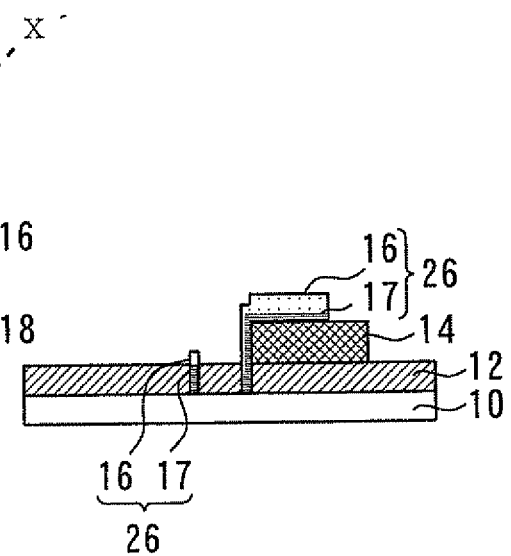

FIGS. 3A and 3B are diagrams illustrating the step of forming an electrode in contact with the semiconductor 10 (hereinafter referred to as the "electrode forming" step). This step is performed immediately after the above insulating film forming step, and begins by etching away a predetermined portion of the first insulating film 12 to expose the area where the electrode is to be formed in contact with the semiconductor 10. As a result, an annular trench that reaches the surface of the semiconductor 10 is formed in the first insulating film 12, thereby exposing the corresponding annular portion of the surface of the semiconductor 10. Next, a Ti layer 17 is formed on the exposed portion of the surface of the semiconductor 10 (within the trench). The Ti layer 17 extends to cover the walls of the trench and a sidewall of the second insulating film 14 and partially cover the top surface of the second insulating film 14. Thus, the Ti layer 17 includes several integrally formed portions. The plan view of this Ti layer 17 is as shown in FIG. 1C. An Au layer 16 is then formed to just cover the top surface of the Ti layer 17. The Ti layer 17 and the Au layer 16 together form an electrode 26. The plan view of the electrode 26 is also as shown in FIG. 1C. The electrode 26 includes an annular portion F, a connection portion E, and a round portion D. The annular portion F of the electrode 26 is in contact with the surface of the semiconductor 10 and extends perpendicular thereto. Further, the connection portion E and the round portion D of the electrode 26 are formed on the top surface of the second insulating film 14 and also extend perpendicular to the surface of the semiconductor 10. It should be noted that the electrode 26 may be formed by lift-off, etc.

FIGS. 4A and 4B are diagrams illustrating the step of forming an insulating film protecting resist 30 (hereinafter referred to as the "insulating film-protecting resist-forming" step). This step is performed immediately after the above electrode forming step. In this step the insulating film protecting resist 30 is formed over the entire exposed surfaces of the first insulating film 12 and the second insulating film 14 so as to partially or entirely expose the top surface of the Au layer 16, or the electrode 26 (see FIG. 4B). More specifically, a coating of photoresist is formed over the entire surface of the wafer and then patterned into a resist mask (i.e., the insulating film protecting resist 30). It should be noted that the insulating film protecting resist 30 serves to protect the first and second insulating films 12 and 14. Thus, as a result of this step, the surface of the wafer is covered with the Au layer 16 and the insulating film protecting resist 30.

FIGS. 5A and 5B are diagrams illustrating the step of forming a power supply layer 32 (hereinafter referred to as the "power supply layer forming" step). This step is performed immediately after the above insulating film-protecting resist-forming step. According to the present embodiment, the power supply layer 32 is a metal layer of Au and is used for plating. Specifically, in this step the power supply layer 32 is formed to cover the exposed surface of the Au layer 16 and the surfaces of the insulating film protecting resist 30.

Figure 6A:
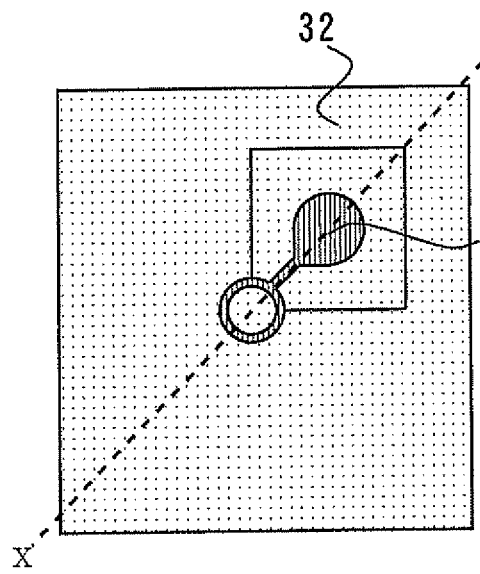
FIG. 6 is diagram illustrating the step of plating the top surface of the electrode with a metal coating.
Figure 6B:
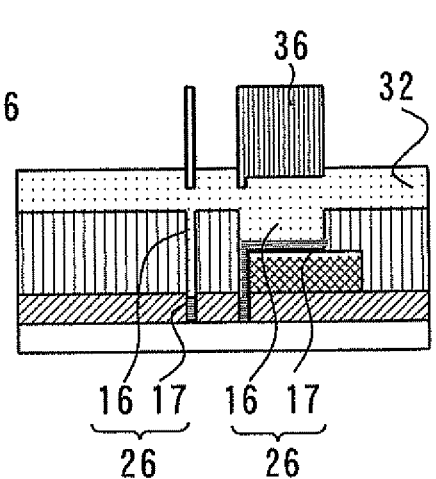

FIGS. 6A and 6B are diagrams illustrating the step of plating the top surface of the electrode with a metal coating 36 (hereinafter referred to as the "plating" step). This step is performed immediately after the above power supply layer forming step. Specifically, after the power supply layer 32 is formed as shown in FIGS. 5A and 5B, a coating of photoresist for plating is formed over the entire surface of the wafer and patterned to expose the top surface of the electrode 26 (on which the metal coating is to be formed). Next, the exposed top surface of the electrode 26 is plated with the metal coating 36, and then the resist pattern for plating is removed. Thus, the metal coating 36 just covers the entire top surface of the electrode 26. This metal coating serves to provide resistance to external force applied to the semiconductor photodetector or the electrode due to wire bonding, etc. It generally has a greater thickness than the power supply layer. It should be noted that the plan view of the metal coating 36 is also as shown in FIG. 1C.

Figure 7A:
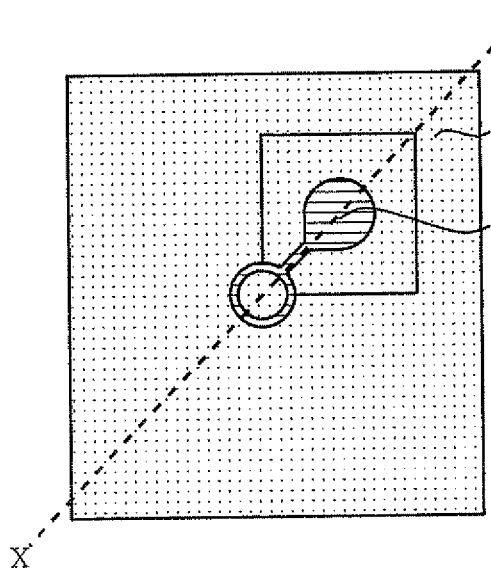
FIG. 7 is diagram illustrating the step of forming a power supply layer etching resist.
Figure 7B:
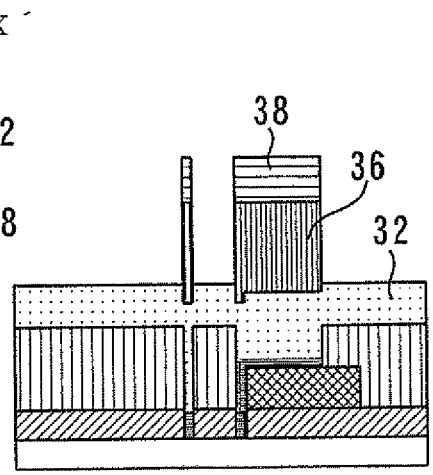

FIGS. 7A and 7B are diagrams illustrating the step of forming a power supply layer etching resist 38 (hereinafter referred to as the "power supply layer-etching resist-forming" step). This step is performed immediately after the above plating step. The reason for performing this step before etching the power supply layer 32 is as follows. If the power supply layer 32 is removed by etching without the above resist immediately after the formation of the metal coating 36, it may result in a reduction in the thickness of the metal coating 36. Therefore, the power supply layer etching resist 38 is formed on the metal coating 36, as shown in FIGS. 7A and 7B, to prevent a reduction in its thickness when the power supply layer 32 is etched. It should be noted that the resist 38 is formed by forming a coating of photoresist over the entire surface of the wafer and patterning it.

Figure 8A:
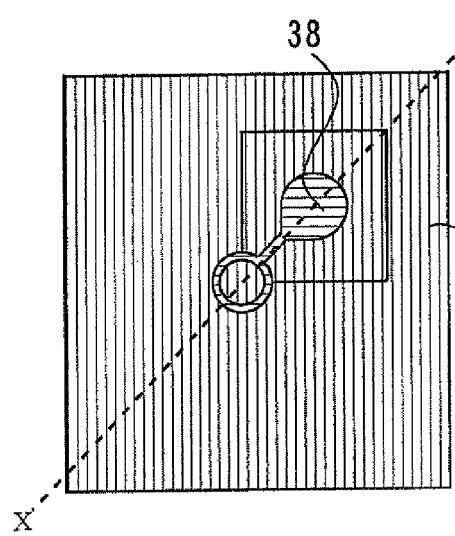
FIG. 8 is diagram illustrating the step of etching the power supply layer.
Figure 8B:
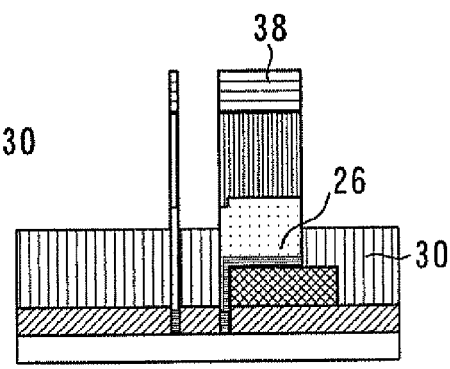

FIGS. 8A and 8B are diagrams illustrating the step of etching the power supply layer 32 (hereinafter referred to as the "power supply layer etching" step). This step is performed after the above power supply layer-etching resist-forming step. Specifically, the portions of the power supply layer that are not covered with the power supply layer etching resist 38 are etched away after the formation of the resist 38. That is, that portion of the power supply layer on the electrode 26 is not etched and remains as an extension to the electrode 26.

Figure 9A:
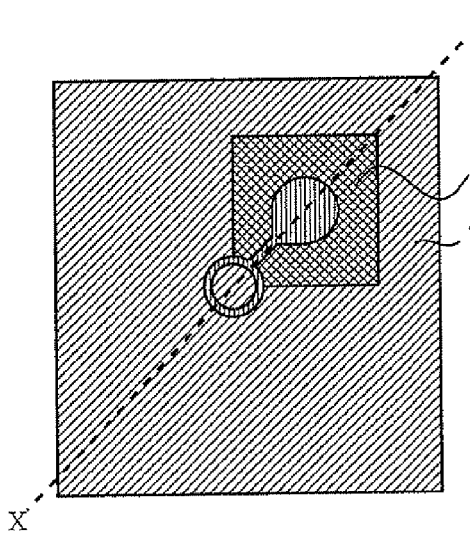
FIG. 9 is diagram illustrating the step of removing the insulating film protecting resist.
Figure 9B:
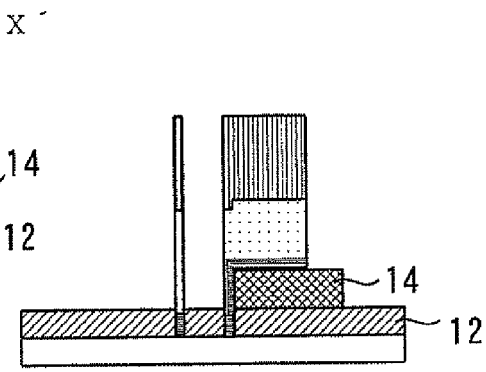

FIGS. 9A and 9B are diagrams illustrating the step of removing the insulating film protecting resist 30 (hereinafter referred to as the "insulating film-protecting resist-removing" step). This step is performed after the above power supply layer etching step. Since the first insulating film 12 and the second insulating film 14 underlie and are in contact with the insulating film protecting resist 30, the removal of the resist 30 is preferably accomplished such that the thicknesses of these insulating films are not reduced. That is, once the insulating film forming step has formed the first and second insulating films 12 and 14 to such thicknesses as to optimize the optical characteristics of the devices the subsequent steps should preferably not change them. Therefore, this step of removing the insulating film protecting resist 30 does not include any treatment that affects the thicknesses of the first and second insulating films 12 and 14, thus maintaining these thicknesses at the desired values. It should be noted that the power supply layer etching resist 38 may also be removed at this insulating film-protecting resist-removing step or it may be removed at another step. FIGS. 9A and 9B shows the results of the insulating film-protecting resist-removing step.

To better understand the features of the present embodiment, it will be helpful to describe a comparative method for manufacturing a semiconductor photodetector with reference to FIGS. 10 to 16. This method begins by first forming an insulating film 102 on a semiconductor (or semiconductor substrate) 100 and then forming an insulating film 104 on a predetermined area of the surface of the insulating film 102, as shown in FIGS. 10A and 10B.

Figure 10A:
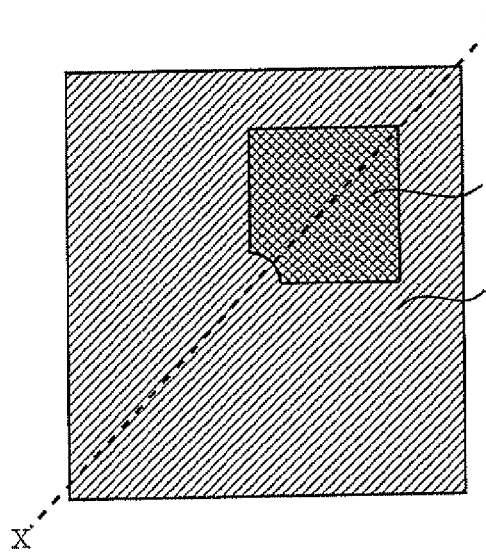
Figure 10B:
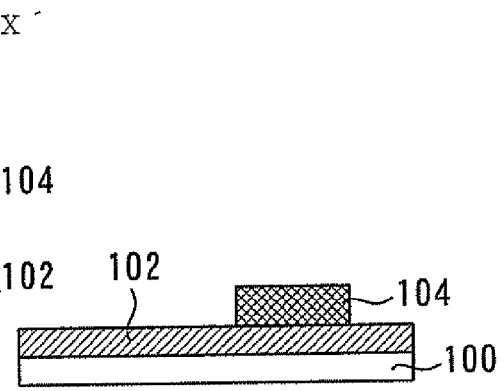
Figure 11A:
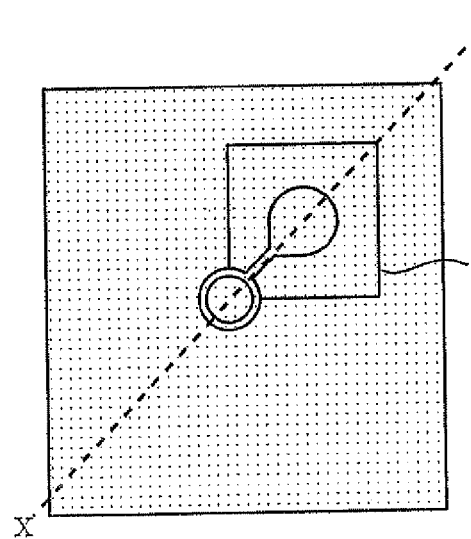
Figure 11B:
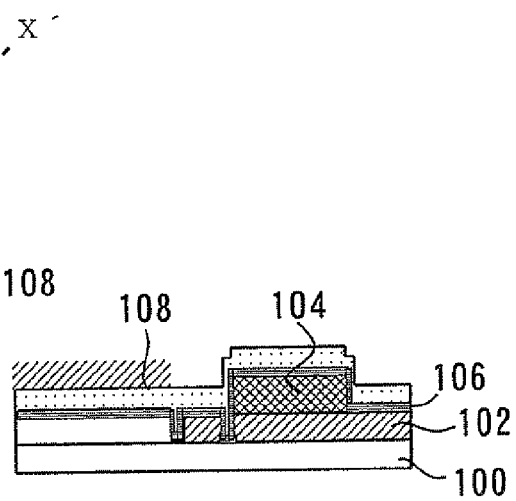

After completion of the formation of the structure shown in FIGS. 10A and 10B, the method proceeds to the step of forming power supply layers (106, 108), as shown in FIGS. 11A and 113. This step begins by etch-forming an annular trench in a predetermined portion of the insulating film 102 to expose the area where an electrode is to be formed in contact with the semiconductor 100, as shown in FIGS. 11A and 11B. A power supply layer Ti106 made of Ti is then formed to cover the etch-exposed surface of the semiconductor 10 and cover the surfaces of the insulating films 102 and 104. That is, the entire surface of the wafer is covered with the power supply layer Ti106. A power supply layer Au108 made of Au is then formed over the entire surface of the power supply layer Ti106. It should be noted that portions of the power supply layers Ti106 and Au108 are not removed by the subsequent steps (including the subsequent plating step) and remain as electrodes in contact with the semiconductor 100.

After completion of the formation of the structure shown in FIGS. 11A and 11B, the method proceeds to the step of plating the power supply layer Au108 with a metal coating 110, as shown in FIGS. 12A and 12B. Specifically, in this step the metal coating 110 is formed on a predetermined area of the surface of the power supply layer Au108. It should be noted that the portions of the power supply layers Ti106 and Au108 under the metal coating 110 will become electrodes (as described later).

After completion of the formation of the structure shown in FIGS. 12A and 12B, the method proceeds to the step of forming a power supply layer etching resist 112, as shown in FIGS. 13A and 13B. Specifically, in this step the power supply layer etching resist 112 is formed over the entire top surface of the metal coating 110.

After completion of the formation of the structure shown in FIGS. 13A and 13B, the method proceeds to the step of etching portions of the power supply layer Au108, as shown in FIGS. 14A and 14B. Specifically, in this step the portions of the power supply layer Au108 that are not covered with the metal coating 110 are etched away. That is, the portion of the power supply layer Au108 under the metal coating 110 remains unetched and is hereinafter referred to as the "Au electrode 114."

Figure 16A:
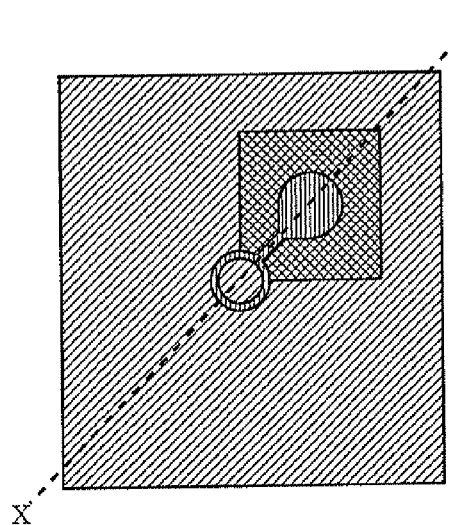
Figure 16B:
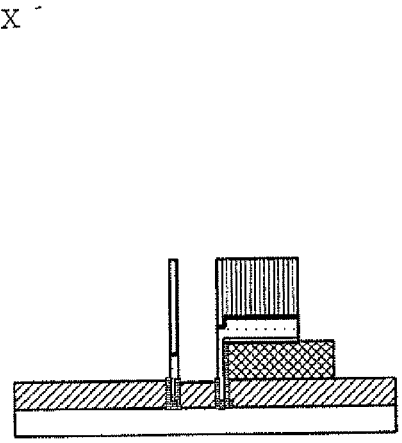

After completion of the formation of the structure shown in FIGS. 14A and 14B, the method proceeds to the step of etching portions of the power supply layer Ti106, as shown in FIGS. 15A and 15B. Specifically, in this step the portions of the power supply layer Ti106 that are not covered with the Au electrode 114 are etched away by using an HF based chemical solution. That is, the portion of the power supply layer Ti106 under the Au electrode 114 remains unetched and is hereinafter referred to as the "Ti electrode 116." After completion of this step, the power supply layer etching resist 112 is removed, as shown in FIGS. 16A and 16B.

This comparative method for manufacturing a semiconductor photodetector has the following disadvantage. Since the power supply layer Ti106 is in contact with the insulating films 102 and 104, these insulating films may undergo a reduction in thickness when the power supply layer Ti106 is etched by the HF based chemical solution. This should be avoided, since at the insulating film forming step the insulating films 102 and 104 are formed to such thicknesses as to optimize the optical characteristics of the device. (The subsequent steps should preferably not change these thicknesses.) More specifically, the insulating films 102 and 104 formed at the insulating film forming step of this comparative method already have the desired thicknesses which allow them to serve as low reflecting coatings. Thus, with this comparative manufacturing method, the HF based chemical solution for etching the power supply layer Ti106 may reach and etch the insulating films 102 and 104, which may prevent the device from having the desired optical characteristics. Furthermore, chemical solutions used for etching other metals may also reduce the thicknesses of the insulating films.

In order to avoid these problems, the method of the present embodiment manufactures a semiconductor photodetector in the following manner. Referring to FIGS. 4 and 5, as described above, the insulating film protecting resist 30 is formed over the entire exposed surfaces of the first insulating film 12 and the second insulating film 14 so as to expose the Au layer (or electrode), and then the power supply layer 32 is formed over the entire surface of the wafer. That is, the power supply layer 32 is not in contact with the first and second insulating films 12 and 14. With this arrangement, the power supply layer 32 can be etched away without reducing the thicknesses of the first and second insulating films 12 and 14, since the insulating film protecting resist 30 protects these films from the etchant. Further, since the electrode 26 (made up of the Ti layer 7 and the Au layer 6 formed on the Ti layer 7) underlies and separates the power supply layer 32 from the semiconductor 10, the power supply layer 32 can be made of Au. It should be noted that, unlike a Ti layer, etching away of an Au layer does not require an HF based chemical solution. Further, a narrow bandgap region (having a narrower bandgap than the other regions of the device) may be formed in the portion of the semiconductor 10 in contact with the electrode 26 to reduce the device resistance. Thus, in accordance with the method of the present embodiment for manufacturing a semiconductor device (having the configuration described above), a metal coating can be formed on the top surface of the upper electrode without reducing the thicknesses of the upper surface insulating films. Further, this method can be adapted to the manufacture of a semiconductor photodetector having a reduced device resistance.

Although the power supply layer 32 has been described as being made of Au, the layer may be made of any suitable metal, such as Ti/Au, that allows it to be removed by a suitable chemical solution. Since the power supply layer 32 is separated from the underlying insulating films by the resist 30, it can be etched away without reducing the thicknesses of these insulating films (which is the primary advantage of the present embodiment).

Although in the present embodiment the power supply layer 32 is etched with the power supply layer etching resist 38 on the metal coating 36, in other embodiments the resist 38 may be omitted while still providing the advantages of the present embodiment. That is, when the metal coating 36 has a considerably greater thickness than the power supply layer 32, it is possible to ignore the damage to the metal coating 36 caused when the power supply layer 32 is etched with no power supply layer etching resist on the metal coating 36.

Further, the step of forming the insulating film protecting resist 30 may be omitted from the method of the present embodiment if the first insulating film 12 and the second insulating films 14 do not undergo an intolerable reduction in thickness when the power supply layer 32 of Au is etched after it is formed in direct contact with these insulating films. It should be noted that, generally, etching an Au layer on an insulating film results in only a slight reduction in the thickness of the insulating film, as compared to when etching a Ti layer on an insulating film (as in the above comparative method). Therefore, the power supply layer may be made of material other than Ti, such as Au, and the insulating film protecting resist 30 may be omitted, which still prevents the thicknesses of the insulating films from being significantly reduced when the power supply layer is etched. That is, a semiconductor photodetector may be manufactured by performing the steps shown in FIGS. 10 to 16 but without forming the power supply layer Ti106.

Although the electrode and the insulating films used in the present embodiment have been described as having a particular shape, they may have other shapes while still falling within the present embodiment.

Figure 9C:
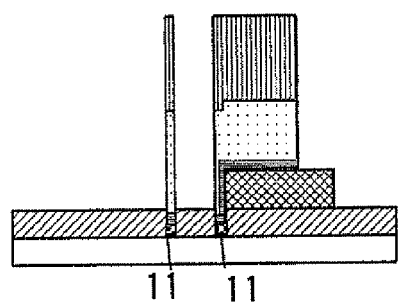

The semiconductor photodetector of the present embodiment may include a narrow bandgap region to reduce the device resistance. FIG. 9C shows a narrow bandgap region 11 disposed in the surface of the semiconductor 10. It should be noted that the narrow bandgap region is formed at least before the formation of the Ti layer 17 (not after completion of the manufacture of the device). The narrow bandgap region 11 serves to reduce the device resistance.

Further, according to the present embodiment, the insulating film protecting resist 30 is formed after forming the electrode 26 having a predetermined thickness. This means that the thickness of the electrode 26 may be adjusted according to the thickness of the insulating film protecting resist 30 to be formed so as to minimize the difference in height between their top surfaces (see FIGS. 4 and 5). Specifically, if the top surface of the electrode 26 is considerably lower than that of the insulating film protecting resist 30, the subsequent formation of the power supply layer 32 (of Au) may not be successful since it must be deposited on the greatly concave or stepped surface formed by these top surfaces. According to the present embodiment, this can be avoided by increasing the thickness of the electrode 26 and thereby reducing the difference in height between the top surfaces of the electrode 26 and the adjacent insulating film protecting resist 30.

Second Embodiment

A second embodiment of the present invention provides a method for manufacturing a semiconductor photodetector in a simpler manner by forming a metal layer that serves as both an electrode and a power supply layer.

Figure 17A:
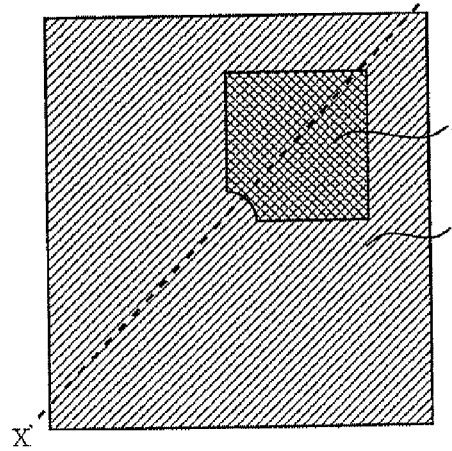
FIG. 17 is diagram illustrating the step of forming insulating films on a semiconductor.
Figure 17B:
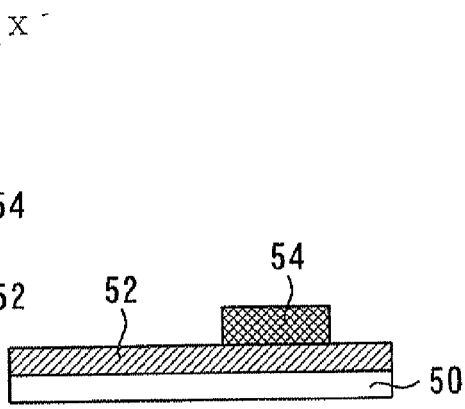

The steps of this method will now be described. FIGS. 17A and 17B are diagrams illustrating the step of forming insulating films on a semiconductor (or semiconductor substrate) 50 (hereinafter referred to as the "insulating film forming" step). Specifically, in this step a first insulating film 52 is formed over the entire surface of the semiconductor 50, and a second insulating film 54 is formed on a predetermined area of the surface of the first insulating film 52, as shown in FIG. 17B. Like the second insulating film 14 of the first embodiment, the second insulating film 54 is of a rectangular shape in plan with one corner cut out to form an arc-shaped recess, as shown in FIG. 17A.

Figure 18A:
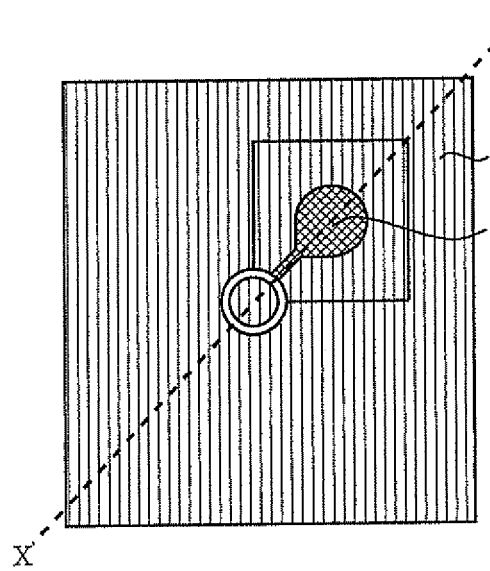
FIG. 18 is diagram illustrating the step of forming an insulating film protecting resist.
Figure 18B:
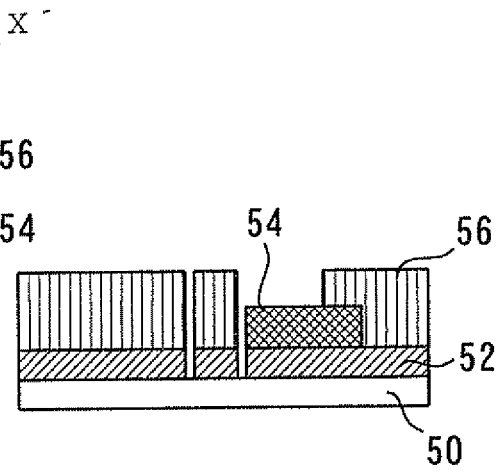

After completion of the formation of the structure shown in FIGS. 17A and 17B, the method proceeds to the step of forming an insulating film protecting resist 56, as shown in FIGS. 18A and 18B. (This step is hereinafter referred to as the "insulating film-protecting resist-forming" step.) In this step, the insulating film protecting resist 56 is formed on the surfaces of the first and second insulating films 52 and 54 except for the area where an electrode is to be formed in contact with the semiconductor 50. As a result, the insulating film protecting resist 56 only partially covers the second insulating film 54. More specifically, the insulating film protecting resist 56 is formed by first forming a coating of photoresist over the entire surface of the wafer and then patterning it.

Figure 19A:
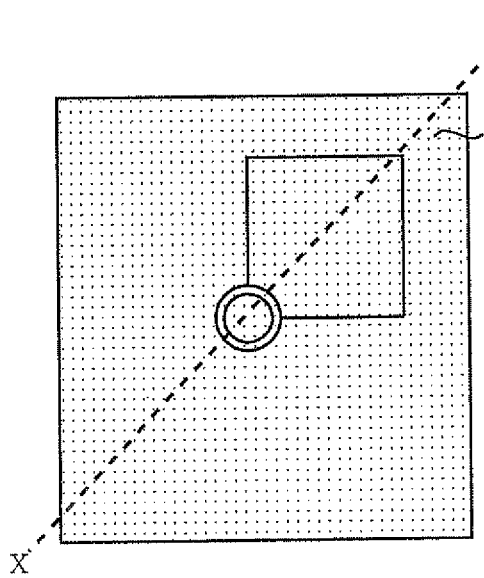
FIG. 19 is diagram illustrating the step of forming a metal layer.
Figure 19B:
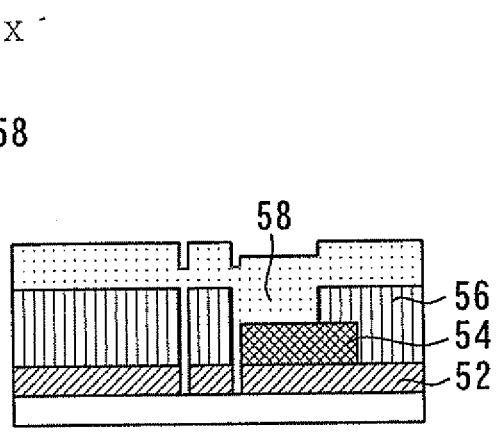

After completion of the formation of the structure shown in FIGS. 18A and 18B, the method proceeds to the step of forming a metal layer 58, as shown in FIGS. 19A and 19B. (This step is hereinafter referred to as the "metal layer forming" step.) In this step, the metal layer 58 is formed to cover the insulating film protecting resist 56 and the area (or trench) where the electrode is to be formed in contact with the semiconductor 50 (that is, the metal layer 58 covers the entire surface of the wafer). More specifically, first a Ti layer is formed to cover the insulating film protecting resist 56, the exposed surfaces of the first and second insulating films 52 and 54, and the exposed surface of the semiconductor 50. An Au layer is then formed over the entire surface of the Ti layer. These metal layers serve as power supply layers for the subsequent plating step. Further, portions of the Ti layer and the Au layer are not removed by the subsequent steps and remain as electrodes. It should be noted that in FIGS. 19A and 19B the Ti layer and the Au layer are collectively shown as the metal layer 58. Thus, as a result of this step, the surface of the wafer is covered with the Au layer.

Figure 20A:
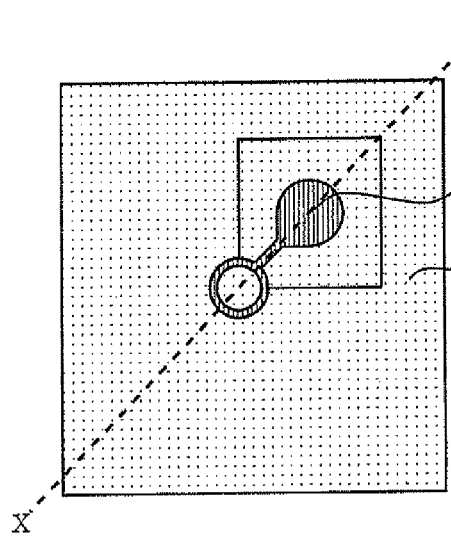
FIG. 20 is the diagram illustrating the step of plating a metal coating on the top surface of the metal layer.
Figure 20B:
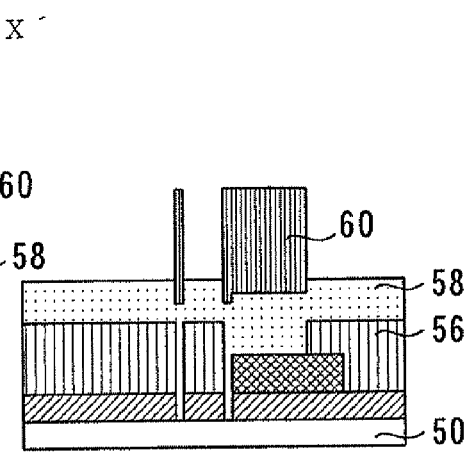

After completion of the formation of the structure shown in FIGS. 19A and 19B, the method proceeds to the step of plating a metal coating 60 on the top surface of the metal layer 58, as shown in FIGS. 20A and 20B. (This step is hereinafter referred to as the "plating" step.) Since this step is similar to the plating step of the first embodiment described with reference to FIGS. 6A and 6B, a description thereof is not provided herein. As described above, the metal layer 58 serves as a power supply layer for the subsequent plating step, and the portion of the metal layer 58 under the metal coating 60 is not removed by the subsequent steps and remains as an electrode.

Figure 21A:
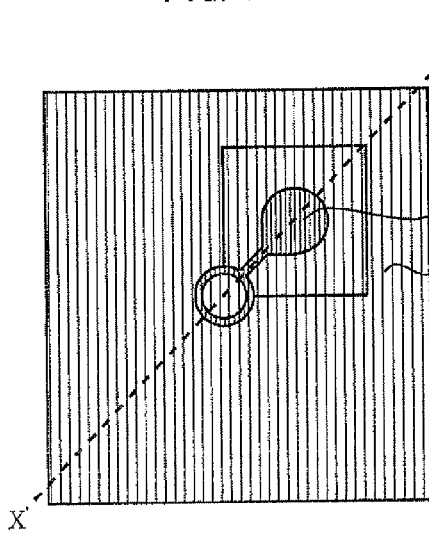
FIG. 21 is the diagram illustrating the step of etching the metal layer.
Figure 21B:
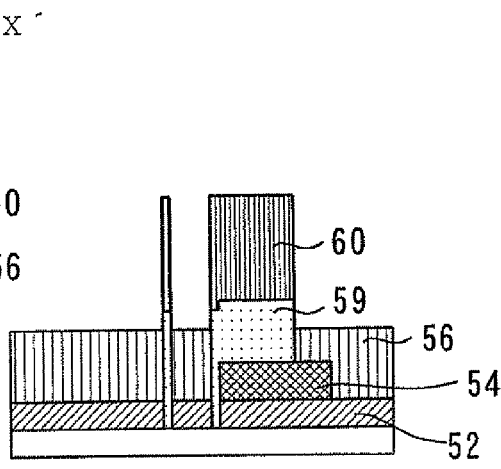

After completion of the formation of the structure shown in FIGS. 20A and 20B, the method proceeds to the step of etching the metal layer 58, as shown in FIGS. 21A and 21B. (This step is hereinafter referred to as the "metal layer etching" step.) Specifically, in this step the metal layer 58 is etched away except for the portion covered by the metal coating 60. The remaining portion of the metal layer 58 serves as the electrode. An HF based chemical solution is used as the etchant, since the metal layer 58 includes the Ti layer. It should be noted that since the portion of the Ti layer under the metal coating 60 is not etched (as described above), the HF based chemical solution does not reach the first and second insulating films 52 and 54 and hence does not reduce their thicknesses. The unetched portion of the metal layer 58 remains as the electrode (59).

Figures 22A, 22B:
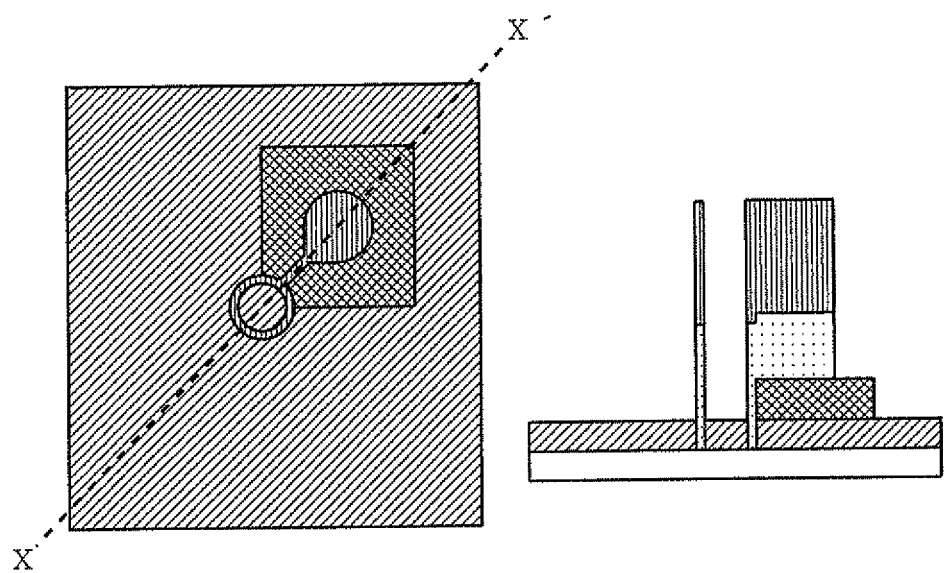
FIG. 22 is the diagram illustrating the step of removing the insulating film protecting resist.

After completion of the formation of the structure shown in FIGS. 21A and 21B, the method proceeds to the step of removing the insulating film protecting resist 56, as shown in FIGS. 22A and 22B. (This step is hereinafter referred to as the "insulating film-protecting resist-removing" step.) This insulating film-protecting resist-removing step completes the manufacture of the semiconductor photodetector as shown in FIGS. 22A and 22B.

Thus, the method of the present embodiment manufactures a semiconductor photodetector in the following manner. Referring to FIGS. 19 and 20, as described above, the metal layer 58 serving as a power supply layer is formed over the entire surface of the wafer, and the metal coating 60 is formed on a predetermined area of the surface of the metal layer 58. The metal layer 58 is then etched away except for the portion covered by the metal coating 60. The unetched portion of the metal layer 58 remains as the electrode 59. This eliminates the need for a separate electrode forming process. Further, when the Ti layer making up the metal layer 58 is etched, the etchant (or chemical solution) does not reach the first and second insulating films 52 and 54 and hence does not reduce their thicknesses, since the insulating film protecting resist 56 covers and protects these films.

Thus, the method of the present embodiment allows the manufacture of a semiconductor photodetector in which the upper surface insulating films have the desired thicknesses and the upper electrode has a protective metal coating thereon, without employing a separate electrode forming step.

Although the electrode and the insulating films used in the present embodiment has been described as having a particular shape, they may have other shapes while still falling within the present embodiment.

A narrow bandgap region having a narrower bandgap than the semiconductor 50 may be formed in the portion of the semiconductor 50 in contact with the electrode to reduce the device resistance, as in the first embodiment.

Although the metal layer 58 has been described as being formed of Ti and Au, it may be made of any suitable material that allows it to serve as both a power supply layer and an electrode.

A power supply layer etching resist may be formed on the metal coating 60 before etching the metal layer 58. The power supply layer etching resist protects the metal coating 60 from damage due to the metal etching.

Further, the step of forming the insulating film protecting resist 56 may be omitted from the method of the present embodiment if such omission does not cause the first and second insulating films 52 and 54 to undergo an intolerable reduction in thickness when the metal layer 58 is etched.

Third Embodiment

Figure 23A:
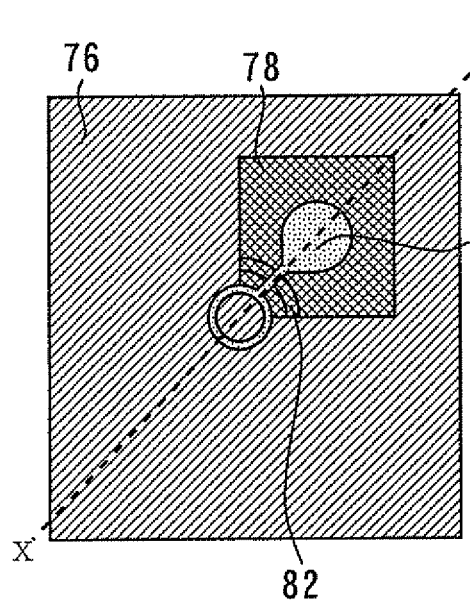
FIG. 23 shows a semiconductor photodetector of the third embodiment.
Figure 23B:
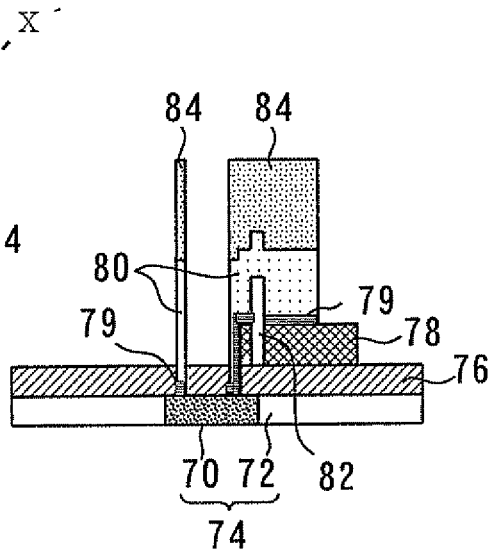
Figure 23C:
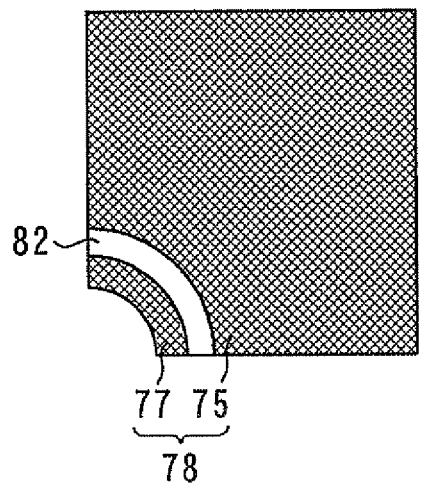

A third embodiment of the present invention provides a semiconductor photodetector whose upper surface insulating films have the desired thicknesses and which exhibits a reduced dark current, and also provides a method for manufacturing such a semiconductor photodetector. FIGS. 23A, 23B, and 23C show a semiconductor photodetector of the present embodiment. FIG. 23B is a cross-sectional view of the photodetector taken along broken line X-X' of FIG. 23A. Referring to FIG. 23B, this semiconductor photodetector includes a semiconductor (or semiconductor substrate) 74 that includes a first conductivity type region 70 and a second conductivity type region 72. A first insulating film 76 is formed over the entire surface of the semiconductor 74 except for the area on and in contact with which an electrode lies.

A second insulating film 78 is provided on the first insulating film 76. Note the area of the upper surface of the first insulating film 76 located directly above the border between the first conductivity type region 70 and the second conductivity type region 72. This area is hereinafter referred to as the "border-overlying area." The second insulating film 78 is formed on two separate regions of the surface of the first insulating film 76 that sandwich the above border-overlying area therebetween. The configuration of the second insulating film 78 will now be described with reference to FIG. 23C, which shows a plan view. The second insulating film 78 includes a first portion 77 and a second portion 75. The first portion 77 has a ring segment shape (or arc shape) in plan, and the second portion 75 has a rectangular shape in plan with one corner cut out to form an arc-shaped recess. A bridge portion 82 is defined between the first and second portions 77 and 75, as shown in FIGS. 23B and 23C. That is, the bridge portion 82 is a narrow empty space that has a ring segment shape (or arc shape) in plan and extends from the border-overlying area of the first insulating film 76 upwardly to a predetermined height.

The semiconductor photodetector further includes a Ti layer 79 of Ti that forms a portion of the electrode and is in contact with the semiconductor 74. The Ti layer 79 extends to cover a predetermined area of the surface of the second insulating film 78. It should be noted that the Ti layer 79 does not extend into the bridge portion 82 above the border-overlying area.

An Au layer 80 is formed on and in contact with the Ti layer 79. The Au layer 80 and the Ti layer 79 together form the electrode of the present embodiment. More specifically, the Au layer 80 covers the entire top surface of the Ti layer 79 and extends to overlie the bridge portion 82. (It does not extend into the bridge portion 82.) The Au layer 80 is integrally formed with the Ti layer 79 to together form the electrode. (On the other hand, as described above, the second insulating film 78 is made up of two separate portions: the first portion 77 and the second portion 75.)

A metal coating 84 just covers the top surface of the Au layer 80. That is, the metal coating 84 has the same plan view configuration as the Au layer 80. This substantially completes the description of the configuration of the semiconductor photodetector of the present embodiment. It should be noted that the bridge portion 82 (which is actually a narrow empty space having a ring segment shape) is enclosed by the combination of the Au layer 80, the Ti layer 79, the second insulating film 78, and the first insulating film 76, except for the two lateral narrow open sides, as shown in FIGS. 23A to 23C.

There will now be described a method of the present embodiment for manufacturing a semiconductor photodetector configured as described above. This semiconductor photodetector includes a semiconductor (or semiconductor substrate) 74 that includes a first conductivity type region 70 and a second conductivity type region 72 that meet at a border (see FIG. 24B). This border plays an important role in the present embodiment, as described below (Although the semiconductor photodetectors of the first and second embodiments also include such a border, it forms no part of the novel features of these embodiments and hence has been omitted from their description.) The method of the present embodiment begins by forming insulating films on the semiconductor 74, as shown in FIGS. 24A and 24B. Specifically, first a first insulating film 76 is formed over the entire surface of the semiconductor 74. (This step is hereinafter referred to as the "first insulating film forming" step.) Next, a second insulating film 78 is formed on two predetermined separate areas of the surface of the first insulating film 76. (This step is hereinafter referred to as the "second insulating film forming" step.) More specifically, the second insulating film 78 includes a first portion 77 and a second portion 75 each formed on a respective one of the above separate areas of the first insulating film 76. Since the second insulating film 78 has been already described with reference to FIG. 23C, a detailed description thereof will not be provided herein.

After completion of the formation of the structure shown in FIGS. 24A and 24B, the method proceeds to the step of forming an electrode, as shown in FIGS. 25A and 25B. (This step is hereinafter referred to as the "electrode forming" step.) Specifically, in this step, first a Ti layer 79 is formed on and in contact with a predetermined area of the surface of the semiconductor 74 (see FIG. 25B). This layer extends to cover a predetermined area of the surface of the second insulating film 78. It should be noted that the Ti layer 79 does not extend into the narrow empty space (described with reference to FIG. 23) formed in the second insulating film 78 and located directly above the border between the first conductivity type region 70 and the second conductivity type region 72 of the semiconductor 74. Next, an Au layer 91 is formed to just cover the top surface of the Ti layer 79. That is, the Ti layer 79 and the Au layer 91 are each formed in two separate areas separated by the narrow empty space located directly above the border, as shown in the plan view of FIG. 25A. The Ti layer 79 and the Au layer 91 form a portion of the electrode.

Figure 26A:
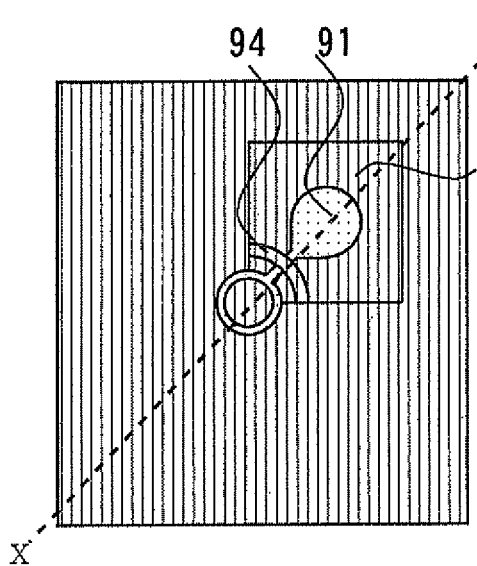
FIG. 26 is the diagram illustrating the step of forming an insulating film protecting resist.
Figure 26B:
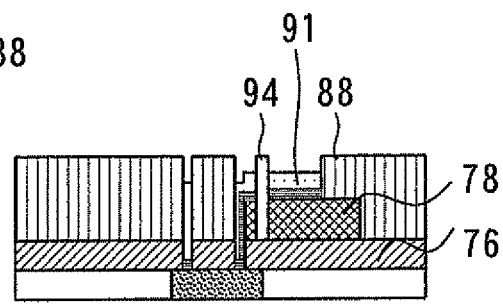
Figure 27A:
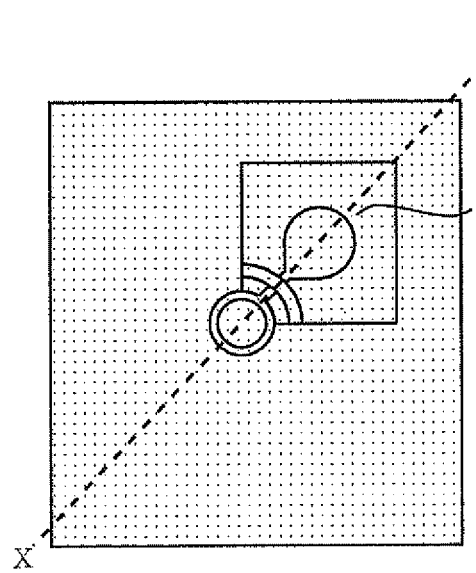
FIG. 27 is the diagram illustrating the step of forming a power supply layer.
Figure 27B:
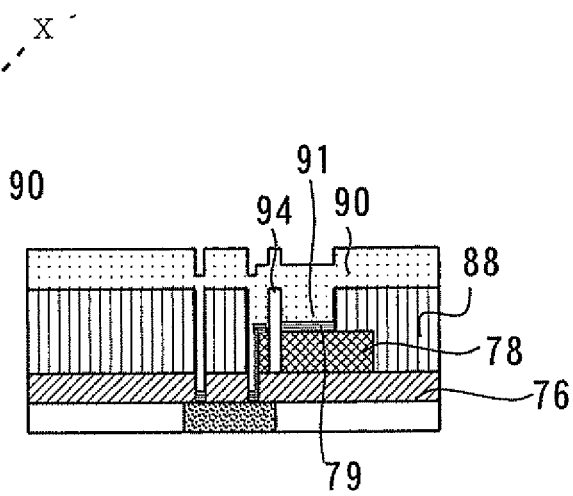

After completion of the formation of the structure shown in FIGS. 25A and 25B, the method proceeds to the step of forming an insulating film protecting resist 88, as shown in FIGS. 26A and 26B. (This step is hereinafter referred to as the "insulating film-protecting resist-forming" step.) Specifically, in this step the insulating film protecting resist 88 is formed on the exposed surfaces of the first insulating film 76 and the second insulating film 78. The insulating protecting resist 88 also fills the narrow empty space which lies above the border between the first conductivity type region 70 and the second conductivity type region 72 and which separates the first and second portions 77 and 75 of the second insulating film 78 from each other and which extends through the Ti layer 79 and the Au layer 91 formed on the second insulating film 78. The portion of the insulating film protecting resist 88 formed within the above narrow space is hereinafter referred to as the "border-overlying resist 94." It should be noted that the thickness of the insulating film protecting resist 88 is greater than the sum of the thicknesses of the second insulating film 78, the Ti layer 79, and the Au layer 91. As a result of this step, the surface of the wafer is covered with the insulating film protecting resist 88 and the Au layer 91, as shown in FIG. 26A. After completion of the formation of the structure shown in FIGS. 26A and 26B, the method proceeds to the step of forming a power supply layer 90, as shown in FIGS. 27A and 27B. (This step is hereinafter referred to as the "power supply layer forming" step.) Specifically, in this step the power supply layer 90 is formed to cover the surfaces of the insulating film protecting resist 88, the Au layer 91, and the border-overlying resist 94. The power supply layer 90 is predominantly composed of Au. It should be noted that the border-overlying resist 94, which has a ring segment shape (or arc shape), is enclosed by the combination of the first insulating film 76, the second insulating film 78, the Ti layer 79, the Au layer 91, and the power supply layer 90, except for the two lateral narrow sides, which are contiguous with the insulating film protecting resist 88.

Figure 28A:
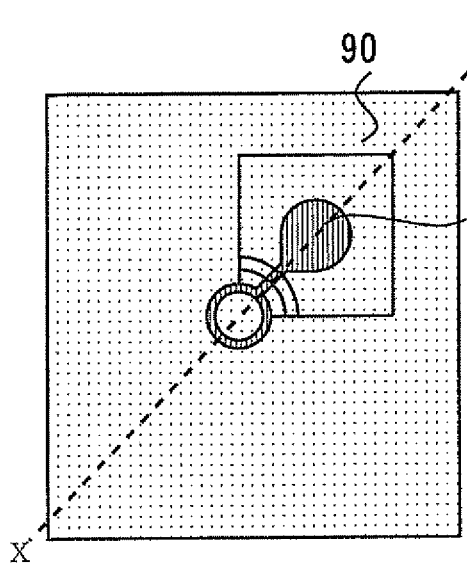
FIG. 28 is the diagram illustrating the step of plating a metal coating.
Figure 28B:
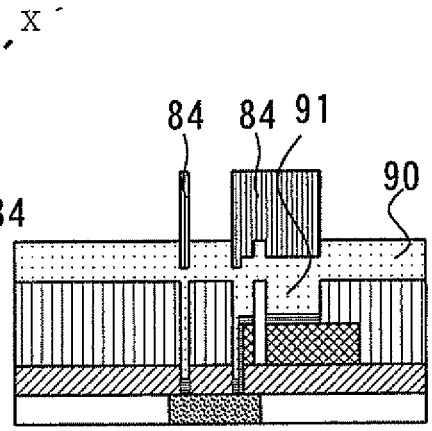

After completion of the formation of the structure shown in FIGS. 27A and 27B, the method proceeds to the step of plating a metal coating 84 on the power supply layer, as shown in FIGS. 28A and 28B. (This step is hereinafter referred to as the "plating" step.) Specifically, in this step, first a coating of photoresist for plating is formed over the entire surface of the wafer and patterned to expose that portion of the surface of the power supply layer 90 where the metal coating 84 is to be formed. Next, the exposed portion of the power supply layer 90 are plated with the metal coating 84 having the desired thickness, and then the resist pattern for plating is removed. Thus, the metal coating 84 just covers the top surface of the Au layer 91. This metal coating serves to provide resistance to external force applied to the semiconductor photodetector or the electrode due to wire bonding, etc. Generally, it has a greater thickness than the power supply layer. A plan view of the metal coating 84 is shown in FIG. 28A.

Figure 29A:
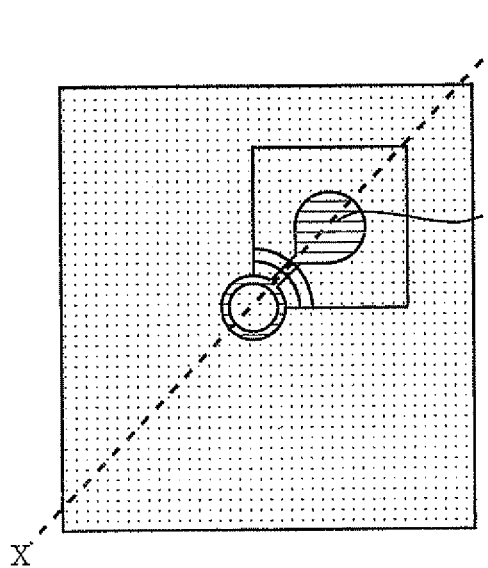
FIG. 29 is the diagram illustrating the step of forming a power supply layer etching resist.
Figure 29B:
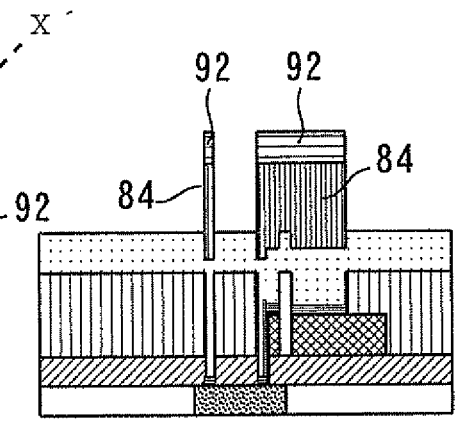

After completion of the formation of the structure shown in FIGS. 28A and 28B, the method proceeds to the step of forming a power supply layer etching resist 92, as shown in FIGS. 29A and 29B. (This step is hereinafter referred to as the "power supply layer-etching resist-forming" step.) Specifically, in this step the power supply layer etching resist 92 is formed on the top surface of the metal coating 84. This etching resist serves to prevent a reduction in the thickness of the metal coating 84 when the power supply layer 90 is etched at the subsequent step.

Figure 30A:
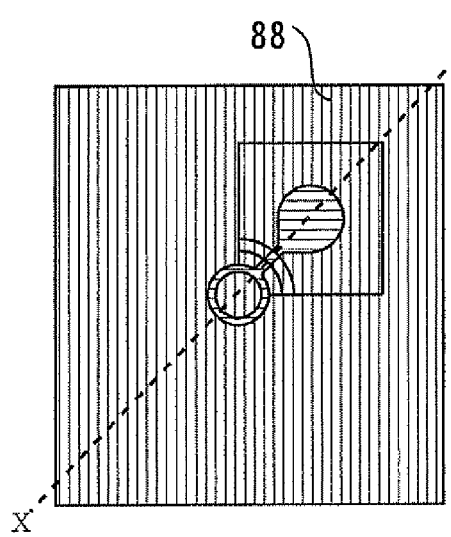
FIG. 30 is the diagram illustrating the step of etching away portions of the power supply layer.
Figure 30B:
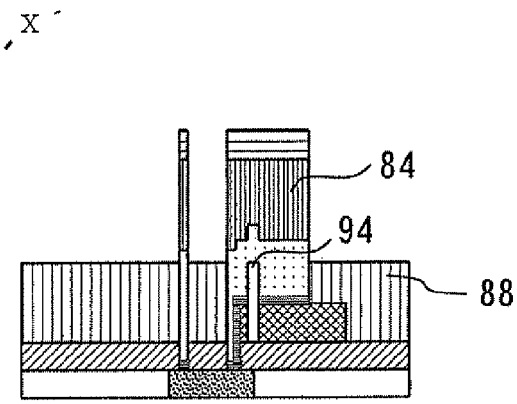

After completion of the formation of the structure shown in FIGS. 29A and 29B, the method proceeds to the step of etching away portions of the power supply layer 90, as shown in FIGS. 30A and 30B. (This step is hereinafter referred to as the "power supply layer etching" step.) Specifically, in this step the portions of the power supply layer 90 that are not covered with the metal coating 84 are etched away, thereby exposing the underlying portions of the insulating film protecting resist 88. That is, the portion of the power supply layer 90 under the metal coating 84 is not removed and remains as a part of the electrode. It should be noted that at that time, the metal coating 84 itself is also not removed since it is covered and protected by the power supply layer etching resist 92. The Au layer 91 and the remaining portion of the power supply layer 90 together form the Au layer 80 described with reference to FIG. 23B.

Figure 31A:
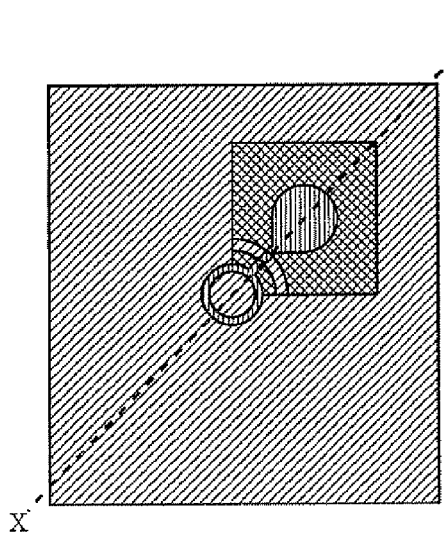
FIG. 31 is the diagram illustrating the step of removing the insulating film protecting resist.
Figure 31B:
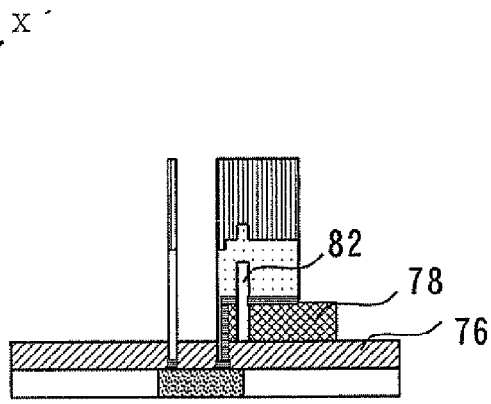

After completion of the formation of the structure shown in FIGS. 30A and 30B, the method proceeds to the step of removing the insulating film protecting resist 88, as shown in FIGS. 31A and 31B. (This step is hereinafter referred to as the "insulating film-protecting resist-removing" step.) In this step, first the power supply layer etching resist 92 is removed.

The insulating film protecting resist 88 is then removed while preventing any substantial reduction in the thicknesses of the underlying first and second insulating films 76 and 78. Further, the border-overlying resist 94 shown in FIG. 30B is also removed from the above narrow space in the same manner as the insulating film protecting resist 88. As a result, the narrow space is empty (i.e., not filled with any solid material). This narrow empty space is referred to as the "bridge portion 82." Thus, the semiconductor photodetector has an air bridge structure in which the bridge portion 82 lies above the border between the first and second conductivity type regions 70 and 72 of the semiconductor 74.

One problem with semiconductor photodetectors has been to reduce their dark current. It has been particularly difficult to reduce the amount of dark current due to the flowing of a leakage current into the junction region between the two semiconductor types in a semiconductor photodetector. This leakage current can be reduced by increasing the thicknesses of the insulating films in contact with the semiconductor regions. However, since the reflectivity of these insulating films depends on their thickness, this may prevent the insulating films from having optimum reflectivity and thus prevent the semiconductor photodetector from having optimum optical characteristics.

The present embodiment provides a solution to this problem. Specifically, in the semiconductor photodetector of the present embodiment described above, the bridge portion 82 (a narrow empty space not filled with any solid material) lies above the border between the first and second conductivity type regions of the semiconductor substrate. This arrangement reduces the leakage current flowing into the border from the insulating films above it, thereby allowing reduction of the dark current of the semiconductor photodetector even when the insulating films are of such thicknesses as to optimize the optical characteristics of the photodetector. Further, in the method of the present embodiment for manufacturing this semiconductor photodetector, the insulating film protecting resist 88 is formed to cover and protect the insulating films (i.e., the first and second insulating film 76 and 78) from the etchant or chemical solution used when the overlying metal layer is etched. That is, the chemical solution does not reach the insulating films and hence does not reduce their thicknesses during the etching process, allowing the thicknesses of these films to be maintained at the desired values. Thus, the present embodiment enables the manufacture of a semiconductor photodetector whose upper surface insulating films are of the desired thicknesses to achieve optimum optical characteristics and which exhibits a reduced dark current.

Although in the present embodiment the insulating film protecting resist 88 is higher than the combined height of the second insulating film 78, the Ti layer 79, and the Au layer 91, in other embodiments it may be lower than that combined height while still ensuring that the bridge portion is large enough to reduce the dark current (which is a primary advantage of the present embodiment).

Although the power supply layer 90 has been described as being made of Au, it may be made up of a Ti layer and an Au layer formed on the Ti layer, since the insulating film protecting resist 88 and the border-overlying resist 94 that cover the insulating films ensure that the chemical solution for etching the power supply layer 90 does not reach these insulating films and hence does not reduce their thickness (which is a primary advantage of the present embodiment). That is, the choice of metal material for the power supply layer may depend on the desired adhesion, ease of plating, etc.

Further, the step of forming the power supply layer etching resist 92 may be omitted from the method of the present embodiment if such omission does not cause the metal layer 84 to undergo an intolerable reduction in thickness when the power supply layer 90 is etched.

The electrode forming step and the power supply layer forming step may be replaced by a single common metal layer forming step such as that described in connection with the second embodiment. Specifically, after the insulating film-protecting resist-forming step, a Ti layer and an Au layer may be formed which serve both as electrodes and power supply layers. This simplifies the method of the present embodiment while still retaining its advantages. Such a method for manufacturing a semiconductor photodetector will now be described. The method begins by forming a first insulating film 76 and a second insulating film 78 on a semiconductor (or semiconductor substrate) 74, as shown in FIGS. 24A and 24B. Next, an insulating film protecting resist 88 is formed on the surfaces of the first insulating film 76 and the second insulating film 78 except for the areas where an electrode is to be formed, as shown in FIGS. 32A and 32B. The method then proceeds to the step of forming a metal layer 200, as shown in FIGS. 33A and 33B. Specifically, the metal layer 200 is made up of a Ti layer and an Au layer formed on the Ti layer. It is formed to cover the areas of the first and second insulating films and the semiconductor 74 where the electrode is to be formed and also cover the surface of the insulating film protecting resist 88. That is, the metal layer 200 covers the entire surface of the wafer. The method then performs the steps described with reference to FIGS. 28 to 31.

Although the electrode and the insulating films used in the present embodiment have been described as having a particular shape, they may have other shapes while still falling within the present embodiment.

Further, a narrow bandgap region having a narrower bandgap than the semiconductor 74 may be formed in the portion of the semiconductor 74 in contact with the electrode to reduce the device resistance, as in the first embodiment.

The present invention allows a semiconductor photodetector to be manufactured in such a way as to prevent a reduction in the thicknesses of its upper surface insulating films, as well as to reduce the dark current.

[Fixed Phrase]

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-241061, filed on Sep. 18, 2007 including specification, claims, drawings and summary, on which the Convention priority of the present application is based, are incorporated herein by reference in its entirety.

What is claimed is:

1. A method for manufacturing a semiconductor photodetector, comprising, sequentially:
   forming an insulating film on a surface of a semiconductor substrate;
   forming an opening in said insulating film, thereby exposing part of said surface of said semiconductor substrate;
   forming an electrode in physical and electrical contact with said surface of said semiconductor substrate, in the opening, and covering only a part of said insulating film;
   forming a patterned protective resist film covering said insulating film and leaving said electrode exposed;
   forming a metal power supply layer on said protective resist film and on and in physical and electrical contact with said electrode that is exposed with respect to said protective resist film;

forming a patterned plating resist film covering said metal power supply layer, except opposite said electrode, said metal power supply layer being exposed opposite said electrode;

plating a plated metal layer on said metal power supply layer where said metal power supply layer is exposed, opposite said electrode;

removing said plating resist film;

forming a patterned etching resist covering said plated metal layer and leaving said metal power supply layer exposed where said plated metal layer is absent;

etching and removing the part of said metal power supply layer that is not covered by said etching resist film and said plated metal layer, thereby exposing said protective resist film; and removing said protective resist film without etching said insulating film.

2. A method for manufacturing a semiconductor photodetector, comprising, sequentially:

forming an insulating film on a surface of a semiconductor substrate;

forming a patterned protective resist film on said insulating film, leaving a part of said insulating film exposed;

using said protective resist film as a mask, forming an opening in said insulating film, thereby exposing part of said surface of said semiconductor substrate;

forming a metal power supply layer on and in physical and electrical contact with said surface of said semiconductor substrate, and on said insulating film where said insulating film is exposed with respect to said protective resist film, and on said protective resist film;

forming a patterned plating resist film covering said metal power supply layer, except opposite said surface of said semiconductor substrate and said insulating film where said semiconductor substrate and said insulating film are exposed with respect to said protective resist film;

plating a metal plated layer on the part of said metal power supply layer that is exposed with respect to said plating resist film, said metal plated layer being an electrode;

removing said plating resist film, thereby exposing said metal power supply layer, except where said metal power supply layer is covered by said electrode;

etching and removing the part of said metal power supply layer not covered by said metal plated layer; and removing said protective resist film without etching said insulating layer.

3. A semiconductor photodetector comprising:

a semiconductor substrate having a surface, said semiconductor substrate including a first conductivity type region at said surface and a second conductivity type region at said surface, wherein said second conductivity type region is in contact with said first conductivity type region at an interface within said semiconductor substrate;

a first insulating film covering said surface of said semiconductor substrate;

a second insulating film on a part of said first insulating film and including a void region extending entirely through said second insulating layer and located directly opposite the interface of said first and second conductivity type regions; and an electrode in contact with said second insulating film and including an air bridge structure electrically bridging, covering, and directly exposed to the void region of said second insulating film, wherein said air bridge structure is located directly opposite the interface of said first and second conductivity type regions so that the interface, the void region, and said air bridge structure are sequentially located, in that order, along a straight line transverse to said surface of said semiconductor substrate.

4. A method for manufacturing a semiconductor photodetector, comprising, sequentially:

forming a first insulating film on a surface of a semiconductor substrate, said semiconductor substrate including, at said surface, first and second conductivity type regions contacting each other at an interface, said first insulating film extending across said interface between said first and second conductivity type regions;

forming a second insulating film covering only a part of said first insulating film, wherein said second insulating film includes mutually spaced apart first and second portions, separated by a void region located directly opposite the interface, the void region defining lateral first side surfaces of said first and second portions of said second insulating film, the first side surfaces extending perpendicular to said surface of said semiconductor substrate;

forming an opening in said first insulating film extending to said surface of said semiconductor substrate, at said first conductivity type region, and adjacent a second side surface of said second portion of said second insulating film;

forming an electrode on and in physical and electrical contact with said surface of said semiconductor substrate in the opening, on a side surface of said second portion of said second insulating film, and covering a portion of a top surface of said first portion of said second insulating film, generally parallel to said surface of said semiconductor;

forming a patterned protecting resist film covering said first and second insulating films, said protecting resist film filling the void region in said second insulating film that is located directly opposite the interface between said first and second conductivity type regions, and leaving said electrode exposed;

forming a metal power supply layer protecting resist film and on said electrode;

forming a patterned plating resist film covering said metal power supply layer, except opposite said electrode, said metal power supply layer being exposed opposite said electrode;

plating a metal plated layer on said metal power supply layer where said metal power supply layer is exposed with respect to said plating resist film;

removing said plating resist film;

forming a patterned etching resist film covering said metal plated layer and leaving said metal power supply layer exposed where said metal plated layer is absent;

etching and removing the part of said metal power supply layer that is not covered by said etching resist film and said metal plated layer, thereby exposing said protective resist film; and removing said protecting resist film and said etching resist film without etching said first and second insulating films.

5. The method as claimed in claim 1, further comprising forming a narrow bandgap region in the opening and in contact with said surface of said semiconductor substrate and in contact with said electrode, said narrow bandgap region having a narrower bandgap than said semiconductor substrate.

6. The method as claimed in claim 1, wherein forming the electrode comprises sequentially forming a film of titanium and a film of gold.

7. The method as claimed in claim 1, further comprising forming said metal power supply layer and said metal plated layer of gold.

8. The method as claimed in claim 1, wherein forming said insulating film comprises forming a first insulating film on said surface of said semiconductor substrate and forming a second insulating film covering only a part of said first insulating film,
- forming an opening in said insulating film comprises forming an opening in said first insulating film adjacent a side surface of said second insulating film, and
- forming said electrode comprises forming a first part of said electrode in the opening in said first insulating film and on a side surface of said second insulating film, transverse to said surface of said semiconductor substrate, and forming a second part of said electrode on a top surface of said second insulating film, generally parallel to said surface of said semiconductor substrate, wherein said metal power supply layer is formed on said second part of said electrode.

9. The method as claimed in claim 2, wherein forming the metal power supply layer comprises sequentially forming a titanium film and a gold film.

10. The method as claimed in claim 2, including plating gold as the metal plated layer.

11. The method as claimed in claim 2, wherein
- forming said insulating film comprises forming a first insulating film on said surface of said semiconductor substrate and forming a second insulating film covering only a part of said first insulating film,
- forming an opening in said insulating film comprises forming an opening in said first insulating film adjacent a side surface of said second insulating film; and
- forming said metal power supply layer comprises forming a first part of said metal power supply layer in the opening in said first insulating film and on a side surface of said second insulating film, transverse to said surface of said semiconductor substrate, and a second part of said metal power supply layer on a top surface of said second insulating layer, generally parallel to said surface of said semiconductor substrate.

12. The method as claimed in claim 4, wherein forming the electrode comprises sequentially forming a film of titanium and a film of gold.

13. The method as claimed in claim 4, further comprising forming said metal power supply layer and said metal plated layer of gold.

* * * * *